(12) United States Patent
Sato et al.

(10) Patent No.: US 10,488,967 B2
(45) Date of Patent: Nov. 26, 2019

(54) SHIFT REGISTER CIRCUIT AND TOUCH DISPLAY APPARATUS THEREOF

(71) Applicant: HON HAI PRECISION INDUSTRY CO., LTD., New Taipei (TW)

(72) Inventors: Hideo Sato, New Taipei (TW); Chi-Liang Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 114 days.

(21) Appl. No.: 15/853,911

(22) Filed: Dec. 25, 2017

(65) Prior Publication Data
US 2018/0181244 A1    Jun. 28, 2018

Related U.S. Application Data

(60) Provisional application No. 62/438,990, filed on Dec. 23, 2016.

(51) Int. Cl.
*G06F 3/041* (2006.01)
*G09G 3/3258* (2016.01)

(52) U.S. Cl.
CPC ......... *G06F 3/0412* (2013.01); *G09G 3/3258* (2013.01); *G06F 2203/04112* (2013.01); *G09G 2310/0264* (2013.01)

(58) Field of Classification Search
CPC .... G06F 3/0412; G06F 3/0416; G06F 3/3258; G06F 3/3266; G06F 3/3677; G06F 3/044; G06F 2203/04112; G11C 19/28; G09G 2310/0264; G09G 2310/0286; G09G 2310/08

See application file for complete search history.

(56) References Cited

U.S. PATENT DOCUMENTS

| | | | |
|---|---|---|---|
| 2014/0085285 A1 | 3/2014 | Kim | |
| 2016/0085377 A1* | 3/2016 | Kim | G06F 3/0412 345/174 |
| 2016/0224175 A1* | 8/2016 | Moon | G06F 3/0412 |
| 2016/0275889 A1* | 9/2016 | Yu | G09G 3/3648 |
| 2016/0365050 A1* | 12/2016 | Qing | G09G 3/3677 |

OTHER PUBLICATIONS

Rabaey (ELEC 516 VLSI System Design . . . https://slideplayer.com/slide/3943415/ slide 30, downloaded from https://web.archive.org/web/20161110232325/https://slideplayer.com/slide/3943415/, hereinafter "Rabaey") (Year: 2016).*

* cited by examiner

*Primary Examiner* — Mark Edwards
(74) *Attorney, Agent, or Firm* — ScienBiziP, P.C.

(57) ABSTRACT

A shift register operates in a display period and a touch period in turn. The shift register circuit comprises a plurality of shift register units. Each shift register unit generates a pulse signal to a gate line, a following adjacent shift register unit, and an anterior adjacent shift register unit. Each shift register unit comprises a flip-flop (FF) circuit and an output circuit. The FF circuit controls potentials of an internal terminal and an internal inverted terminal based on a received a setting signal and a received reset signal. The output circuit generates the pulse signal related to a clock signal under a control of the internal terminal and the received internal inverted terminal. During the touch period, the potential of the internal terminal and the potential of the internal inverted terminal remain the same as the potential in the anterior display period.

17 Claims, 19 Drawing Sheets

SHIFT REGISTER CIRCUIT AND TOUCH DISPLAY APPARATUS THEREOF

CROSS-REFERENCE TO RELATED APPLICATIONS

This application claims priority to U.S. provisional patent application No. 62/438,990 filed on Dec. 23, 2016, the contents of which are incorporated by reference herein.

BACKGROUND

Field

The subject matter herein generally relates to a shift register circuit and touch display apparatus thereof.

Background

A touch display apparatus includes a plurality of gate lines, a plurality of data lines, and a pixel array driving circuit. The gate lines and the data lines cross each other to define a plurality of pixels. The pixel array driving circuit drives the pixel. The pixel array driving circuit includes a gate driver circuit which includes a plurality of shift registers and a date driver circuit. Each shift register is configured to apply a scanning signal to one of the gate lines, and the data driver circuit is configured to apply data signals to the data lines. In one frame scanning cycle period includes display scanning periods for displaying an image and touch scanning periods for sensing touch operations on the touch display apparatus.

Referring to FIGS. 17-19, which illustrate one of shift registers of a gate driving circuit of a conventional touch display apparatus with a built-in touch function. The shift register 900 includes a flip-flop (FF) circuit 910 and an output circuit 980. The FF circuit 910 is a dynamic type FF circuit. The FF circuit 910 receives a setting signal S at a trigger terminal, a reset signal R at a reset terminal, and outputs a signal from an internal terminal Q and a signal from an inverted terminal QB. The output circuit 980 is a bootstrap switch type circuit, and applies a pulse signal to the corresponding gate line through an output signal O based on the control of the received signal from the internal terminal Q, the received signal from the internal inverted terminal QB, and a clock signal CK. The FF circuit 910 includes a first transistor T1, a second transistor T2, a third transistor T3, and a fourth transistor T4. The output circuit 980 includes a pull-up transistor T5, a pull-down transistor T6, a first capacitor C1, and a second capacitor C2. The pull-up transistor T5 is a bootstrap switch, the capacitor C1 is a bootstrap capacitor. As shown in FIG. 18, when the potential of the clock signal CK increases from a low level voltage to a first level voltage with a first voltage, and the potentials of the set signal S and the reset signal R are in the low level voltage, the potential of the internal terminal Q increases from the first level voltage to a second level voltage, which has a second level voltage greater than the first level voltage. Thus, the potential of the internal terminal Q is bootstrapped based on the first capacitor C1, and the pulse signal of the output terminal O increases from the low level voltage to the high level voltage. When the clock signal CK decreases from the high level voltage to the low level voltage, the potential of the internal terminal Q decreases from the second level voltage to the first level voltage, and accordingly, the pulse signal of the output terminal O decreases from the high level voltage to the low level voltage. The potential of the internal terminal Q is used as a trigger signal for trigging the output circuit 980.

However, as shown in FIG. 19, the clock signal CK only provided during the display scanning period, and maintains in the low level voltage during the touch scanning period. During the touch scanning period, the potential of the internal terminal Q of the FF circuit 910 decreases according to an off-state leakage current of the first transistor T1 and the second transistor T2. The decreasing voltage $\Delta V$ is substantially equal to $(I_{off} \times T)/C_1$, which $I_{off}$ denotes the total off-state current of the first transistor T1 and the second transistor T2, T denotes time length for the touch scanning period, and C1 denotes the capacity of the first capacitor C1. As a result, an ON-state resistance of the transistor T5 correspondingly increases, such that more time is needed to make the pulse signal of the output terminal O increases to the high level voltage and also more time is needed to make the pulse signal of the output terminal O decreases to the low level voltage, which causes a horizontal lines defect will appear on the touch display apparatus.

As a solution to the above problem, it is conceivable to increase the capacitance of the capacitor C1 or to decrease the off-state current $I_{off}$. However, if enlarging the capacitance of the capacitor C1 or enlarging the size of the transistor T1, an area occupied by the gate driver circuit is increased.

BRIEF DESCRIPTION OF THE FIGURES

Implementations of the present technology will now be described, by way of example only, with reference to the attached figures.

DETAILED DESCRIPTION

Figure 1:
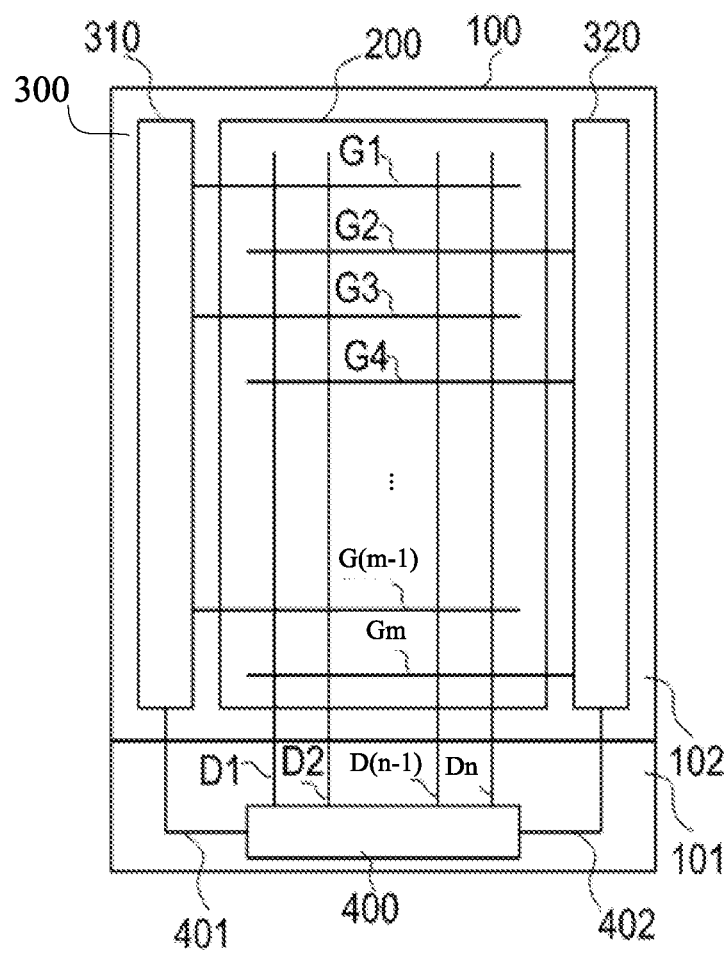
FIG. 1 is a schematic planar view of a touch display apparatus, the touch display apparatus comprises a first shift register circuit and a second shift register circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

The present disclosure is described in related to a shift register circuit suitable for a touch display apparatus. In the shift register circuit of the embodiments, a voltage change of a signal from an internal output terminal and a signal from the internal inverted terminal of a flip-flop circuit in the shift register circuit in a touch scanning period is effectively suppressed. As a result, it is possible to obtain the effect of suppressing the occurrence of a horizontal line which was a problem in the touch display apparatus.

FIG. 1 illustrates an exemplary embodiment of the touch display apparatus 1. In the exemplary embodiment, the touch display apparatus 1 can be, for example, an organic light emitting display (OLED), or a liquid crystal display (LCD). In the exemplary embodiment, the touch display apparatus 1 is an in-cell touch display apparatus, and includes a display panel 100 integrated with a touch structure in a cell of the display panel. The display panel 100 is substantially a rectangular. The display panel 100 defines a display region 200 and a non-display region 300. The non-display region 300 surrounds the display region 200.

The display panel 100 includes an opposite substrate 101, such as a color filter (CF) substrate, and a thin film transistor (TFT) array substrate 102 adjacent to the opposite substrate 101. The TFT array substrate 102 includes a pixel driving circuit for driving pixels of the display panel 100. The display panel 100 further includes a first gate driving circuit 310, a second gate driving circuit 320, and a control IC 400. The first gate driving circuit 310 and the second gate driving circuit 320 in the non-display region 300 are symmetrically located on opposite sides of the display region 200, and are located on the TFT substrate 102. The control IC 400 respectively generates control signals to control the first gate driving circuit 310 through a first control line 401 and control the second gate driving circuit 320 through a second control line 402. The display panel 100 further includes a plurality of gate lines G1-Gm and a plurality of data lines D1-Dn. The gate lines G1-Gm and the data lines D1-Dn are crossed with each other. The gate lines G1-Gm are parallel with each other along a first direction X, and the data lines D1-Dn are parallel with each other along a second direction Y. Pixels (not shown) are defined at a cross section portion of the gate lines G1-Gm and the data lines D1-Dn. In the exemplary embodiment, the second direction Y is perpendicular to the first direction X. The gate lines G1, G3, . . . Gm−1 in odd rows are electrically connected to the first gate driving circuit 310, and the gate lines G2, G4, . . . Gm in even rows are electrically connected to the second gate driving circuit 320. In this exemplary embodiment, m and n are integer, and m is an even number. In the exemplary embodiment, the control IC 400 can further includes source driving control circuit (not shown) and control circuit for controlling the first gate driving circuit 310 and the second gate driving circuit 320. The source driving control circuit are electrically connected to the data lines D1-Dn for providing image data. The control IC 400 also can includes a touch driving control circuit, but not limited. In other exemplary embodiments, the touch display apparatus 1 can use one gate driving circuit for driving all of the gate lines G1-Gm on a side of the display region 200.

Figure 2:
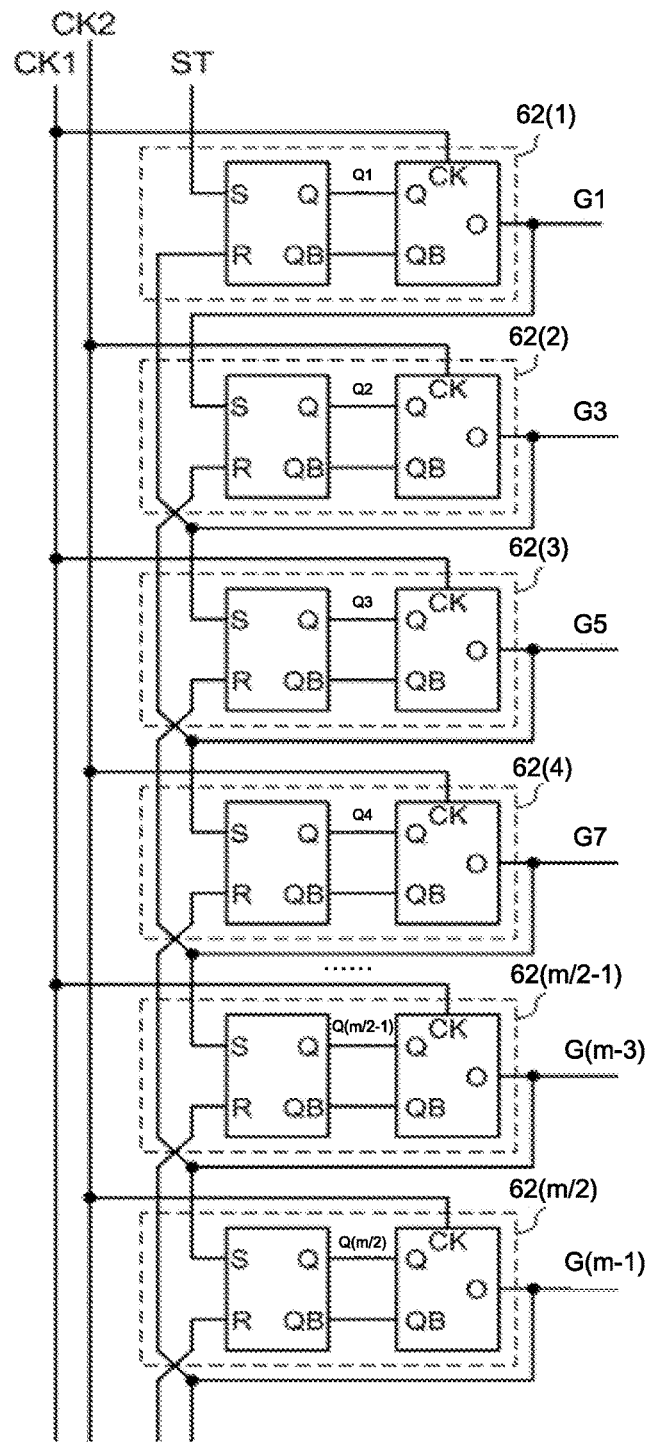
FIG. 2 is a circuit diagrammatic view of a first exemplary embodiment of the first shift register circuit of FIG. 1, the first shift register circuit comprises six shift register units.
Figure 5:
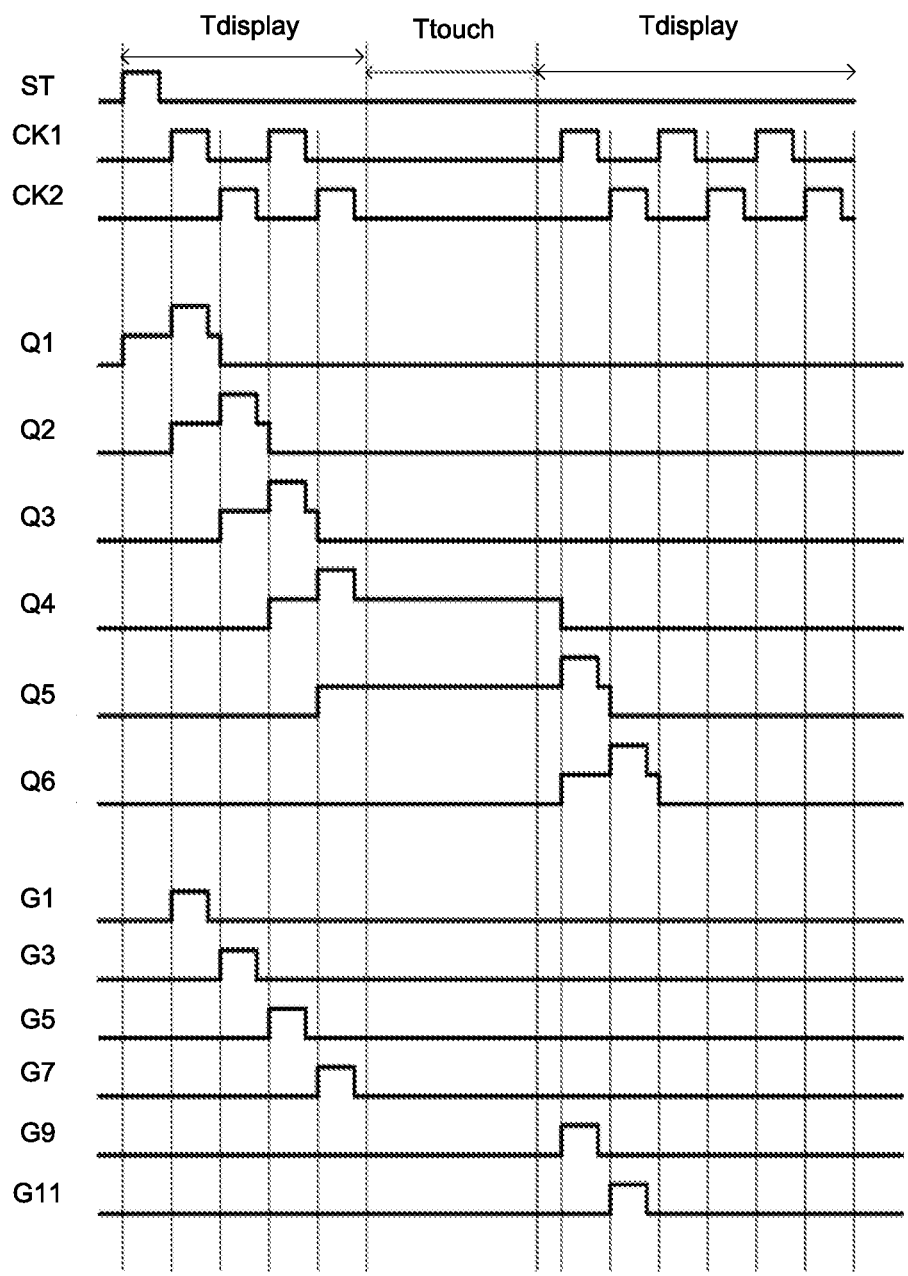
FIG. 5 is a time sequence diagrammatic view the shift register circuit of FIG. 2.

Each the first gate driving circuit 310 and the second gate driving circuit 320 includes at least one shift register circuit 600 (as shown in FIG. 2). FIG. 2 illustrates a circuit diagrammatic view of a first embodiment of the shift register circuit 600 in the first gate driving circuit 310. The shift register circuit 600 is electrically connected to the clock lines (not shown) to receive two clock signals CK, and a scan start line (not shown) to receive a scan start signal ST. In the exemplary embodiment, the shift register circuit 600 receives a first clock signal CK1 and a second clock signal CK2. The shift register circuit 600 includes a plurality of serial-connected shift register units 62, each of which generates a pulse signal as a gate signal to a corresponding one of the gate lines G1, G3, . . . G(m−1) in odd rows, and the shift register circuit 600 of the second driving circuit 320 includes a plurality of shift register units 62, each of which generates the pulse signal as a gate signal to a corresponding one of the gate lines G2, G4, . . . Gm in even rows. Each shift register unit 62 includes a set terminal for receiving a set signal S, a reset terminal for receiving a reset signal R, a control terminal for receiving the clock signal (the first clock signal CK1 or the second clock signal CK2), and an output terminal O for outputting the pulse signal as the gate signal. Each odd numbered shift register unit 62 receives the first clock signal CK1. Each even numbered shift register unit 62 receives the second clock signal CK2. In detail, a first shift register 62(1) receives a scan start signal ST as the set signal S, receives the pulse signal outputted from a following shift register unit 62 as the reset signal R, and receives the first clock signal CK1. The last shift register unit 62(*m*/2) receives the pulse signal outputted from an anterior shift register unit 62(*m*/2-1) as the set signal S and receives the first clock signal CK1. In one exemplary embodiment, when m=12, the shift register circuit 600 in the first gate driving circuit 310 includes six shift registers 62(1)-62(6). The shift register units 62(1)-62(6) correspond to the output terminal O1-O6. The first shift register unit 62(1) outputs the pulse signal to the first gate line G1, the second shift register unit 62(2) outputs the pulse signal to the third gate line G3, the third shift register unit 62(3) outputs the pulse signal to the fifth gate line G5, the fourth shift register unit 62(4) outputs the pulse signal to the seventh gate line G7, the fifth shift register unit 62(5) outputs the pulse signal to the ninth gate line G9, and the sixth shift register unit 62(6) outputs the pulse signal to the eleventh gate line G11. FIG. 2 merely shows a portion of the connections among the shift register units 62 in the first driving circuit 310, and the other shift register units 62 of the shift register circuit 600 which fails to be shown in the drawings follow the same connection method. The shift register circuit 600 is driven by a time-sharing driving method. In one frame, the shift register circuit 600 drives the pixels to operate in a display period Tdisplay (as shown in FIG. 5) and a touch period Ttouch (as shown in FIG. 5) in turn.

The first shift register unit 62(1) receives the scan start signal ST as the setting signal S generated from a timing controller (not shown), the first clock signal CK1, the pulse signal outputted by the second shift register unit 62(2) as the reset signal R, and generates the pulse signal through the output terminal O1, which is applied to the first gate line G1. The second shift register unit 62(2) receives the first gate signal generated from the first shift register unit 62(1) as a setting signal S, the second clock signal CK2, the pulse signal outputted by the third shift register unit 62(3) as the reset signal R, and outputs the pulse signal through the output terminal O2. The pulse signal outputted by the second shift register unit 62(2) is applied to the gate line G2 and is further provided to the first shift register unit 62(1) as a reset signal R. Likewise, the Pth shift register unit 62(*p*) receives the pulse signal outputted by the (P−1)th shift register unit 62(*p*−1) as the setting signal S, and further generates the pulse signal through the output terminal Op. The pulse signal outputted by the Pth shift register unit 62*p* is applied to the gate line Gp and is further provided to the (P+1)th shift register unit 62(*p*+1) as the reset signal R, where P is an integer not less than three, and less than m.

Figure 3:
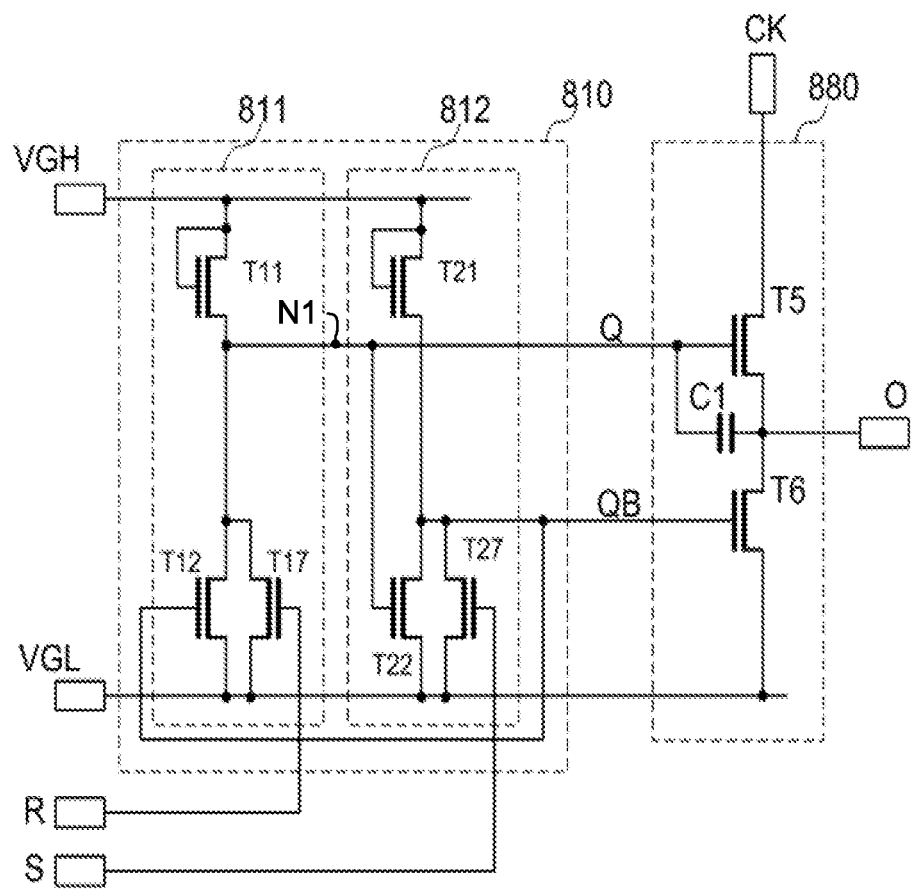
FIG. 3 is a circuit diagrammatic view of a first exemplary embodiment of the shift register unit of FIG. 2.

FIG. 3 is a circuit diagrammatic view of a first embodiment of the shift register unit 62*a*. The shift register units 62 of the shift register circuit 600 are in a same circuit structure. The shift register unit 62*a* includes a static flip-flop (FF) circuit 810 and an output circuit 880. The static FF circuit 810 includes a first terminal for receiving the set signal S, a second terminal for receiving the reset signal R, an internal terminal Q, and an internal inverted terminal QB. The static FF circuit 810 controls potentials of the internal terminal Q and the internal inverted terminal QB based on the received the setting signal S and the reset signal R. The potential of the internal terminal Q is inverted with the potential of the internal inverted terminal QB. The static FF circuit 810 operates between a first state, a second state, and a hold state. When the static FF circuit 810 operates in the first state, the potential of the internal terminal Q is in a high level voltage, and the potential of the internal inverted terminal QB is in a low level voltage; when the static FF circuit 810 operates in the second state, the potential of the internal terminal Q is in the low level voltage, and the potential of the internal inverted terminal QB is in the high level voltage; when the static FF circuit 810 operates in the hold state, the signal outputted by the internal terminal Q remains the potential. In the exemplary embodiment, the static FF circuit 810 holds the potentials of the internal terminal Q and the internal inverted terminal QB during a touch period Ttouch to be same as potentials of an adjacent time in an anterior display period Tdisplay before the touch period Ttouch.

The static FF circuit 810 includes a first static inverted circuit 811 and a second static inverted circuit 812, each of which receives a high voltage and a low voltage. The first static inverted circuit 811 receives the reset signal R from the first terminal, and the second static inverted circuit 812 receives the set signal S from the second terminal. The first static inverted circuit 811 outputs an output signal to a node N1 as the internal terminal Q. The second static inverted circuit 812 generates an output signal as a signal of the internal inverted output terminal QB. The first static inverted circuit 811 and the second static inverted circuit 812 are in a same circuit structure, but are in differently electrically connected. The first static inverted circuit 811 includes a first transistor T11 as a pull-up element, a second transistor T12, and a third transistor T17. The first transistor T11 and the second transistor T12 form an inverted circuit, and the third transistor T17 is used as a reset circuit. The first transistor T11 holds the potential of the internal terminal Q in the touch period Ttouch to be equal to the potential of the internal terminal Q in a time Tm of an anterior display period Tdisplay, which is adjacent to the touch period Ttouch. The second transistor T12 receives the potential of the internal inverted terminal QB as a feedback signal. The third transistor T17 is used as a reset transistor. In the first inverted circuit 811, a gate electrode of the first transistor T11 is electrically connected to a source electrode of the first transistor T11, the source electrode of the first transistor T11 is electrically connected to a first power line VGH, and a drain electrode of the first transistor T11 as the internal terminal Q is electrically connected to a source electrode of the second transistor T12. A gate electrode of the second transistor T12 as the internal inverted terminal QB is connected to the output circuit 880. Source electrodes of the second transistor T12 and the third transistor T17 are connected to each other and further connected to the drain electrode of the first transistor T11. Drain electrodes of the second transistor T12 and the third transistor T17 are connected to each other and further connected to a second power line VGL. A gate electrode of the third transistor T17 receives the reset signal R.

The second static inverted circuit 812 includes a first transistor T21 as a pull-up element, a second transistor T22, and a third transistor T27. The first transistor T21 and the second transistor T22 form an inverted circuit, and the third transistor T27 is used as a reset circuit. The first transistor T21 and the second transistor T22 forms an inverted circuit, and the third transistor T27 is used as a reset circuit. The first transistor T21 holds the potential of the internal inverted terminal QB in the touch period Ttouch to be equal to the potential of the internal inverted terminal QB in a time Tm of an anterior display period Tdisplay, which is adjacent to the touch period Ttouch. The second transistor T22 receives the potential of the internal inverted terminal QB as a feedback signal. The third transistor T27 is used as a reset transistor. In the second inverted circuit 812, the gate electrode of the first transistor T22 is electrically connected to the drain electrode of the first transistor T11. The drain electrode of the first transistor T21 is electrically connected to the output circuit 880. The source electrodes of the second transistor T22 and the third transistor T27 are electrically connected to the output circuit 880.

The output circuit 880 receives the clock signal CK, the potential of the internal terminal Q, and the potential of the internal inverted terminal QB. The output circuit 880 includes a pull-up transistor T5, a pull-down transistor T6, and a capacitor C1. A gate electrode of the pull-up transistor T5 is electrically connected to the drain electrode of the first transistor T11, a source electrode of the pull-up transistor T5 receives the clock signal CK, and a drain electrode of the pull-up transistor T5 is served as the output terminal O. A gate electrode of the pull-down transistor T6 is electrically connected to the drain electrode of the first transistor T21, a source electrode of the pull-down transistor T6 is electrically connected to the output terminal O, and a drain electrode of the pull-down transistor T6 is electrically connected to the second power line VGL. The capacitor C1 is electrically connected between the gate electrode and the drain electrode of the pull-up transistor T5.

Figure 4:
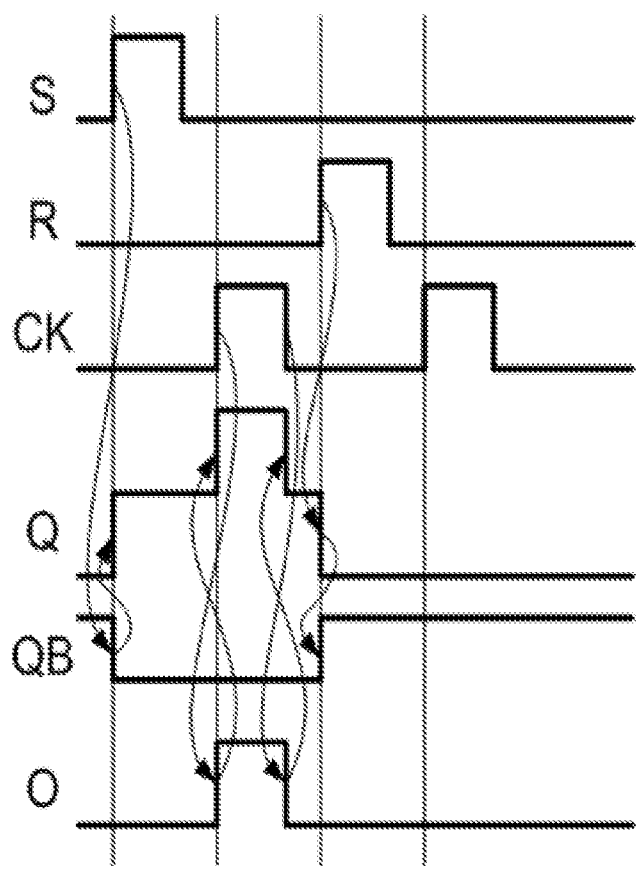
FIG. 4 is a time sequence diagrammatic view of the shift register unit of FIG. 3.

FIG. 4 illustrates a time sequence diagrammatic of the shifter register unit 62 of FIG. 3. When the potential of the setting signal S increases from a low level voltage to a high level voltage, the potential of the internal inverted terminal QB decreases from the high level voltage to the low level voltage, which causes the potential of the internal terminal Q to increase from the low level voltage to a first level voltage. The first capacitor C1 is being charged. When the potential of the setting signal S decreases from the high level voltage the low level voltage, and the reset signal remains in the low level voltage, the potentials of the internal terminal Q and the internal inverted terminal QB stay in a constant state. In other words, the potential of the internal terminal Q is in the high level voltage, and the potential of the internal inverted terminal QB is in the low level voltage. The first capacitor C1 is being further charged. When the potential of the clock signal CK increases from the low level voltage to the high level voltage, the potential of the output terminal O is the same as the clock signal, which increases from the low level voltage to the high level voltage, and the potential of the internal terminal Q to increase from the first level voltage to a second level voltage, which is greater than the first level voltage. When the potential of the clock signal CK decreases from the high level voltage to the low level voltage, the potential of the output terminal O decreases from the high level voltage to the low level voltage, which causes the potential of the internal terminal Q to decrease from the second level voltage to the first level voltage. When the potential of the reset signal R increases from the low level voltage to the high level voltage, the potential of the internal terminal Q decreases from the first level voltage to the low level voltage, and the potential of the internal inverted terminal QB increases from the low level voltage to the high level voltage. The first transistor T21 turns on and the second transistor T22 turns off. The potential of the output terminal O remains in the low level voltage until the potential of the set signal S increase from the low level voltage to the high level voltage.

The setting signal S, the reset signal R, the potential of the internal terminal Q, and the potential of the internal inverted terminal QB of the static FF circuit 810 in the shift register unit 62(n) satisfies the truth table 2.

TABLE 2 a truth table of the FF circuit

| S | R | Q | QB |
|---|---|---|---|
| L | L | Qn − 1 | QB(n − 1) |
| H | L | H | L |
| L | H | L | H |
| H | H | Indefinite value | Indefinite value |

L denotes the high level voltage, H denotes the low level voltage, Qn−1 denotes a potential of the internal terminal Q in a previous state, and QB(n−1) denotes a potential of the internal inverted terminal QB in a previous state.

FIG. 5 shows a time sequence diagrammatic of the shift register circuit 600. The shift register circuit 600 operates in the display period Tdisplay and the touch period Ttouch in turn. The touch period Ttouch is inserted between two adjacent display period Tdisplay. In the display period Tdisplay, the first clock signal CK1 and the second clock signal CK2 are sequentially outputs a pulse signal respectively, and in the touch period Ttouch, both the first clock signal CK1 and the second clock signal CK2 are in the low level voltage. In the exemplary embodiment, m is 12, the shift register circuit 600 firstly operates in the display period Tdisplay for sequentially scanning the gate lines G1, G3, G5, G7, then switches to be operated in the touch period Ttouch for sensing touch operations on the display panel 100, the potentials of the internal terminal Q1-Q6 are in a hold state for being equal to the potential of the internal terminal Q in the time Tm of the anterior display period Tdisplay. When the touch period Ttouch is completed, the shift register circuit 600 operates in the display period Tdisplay for sequentially scanning the rest gate lines G9 and G11. The number of gate lines G1-G6 being scanned in each display period Tdisplay can be adjusted.

Figure 6:
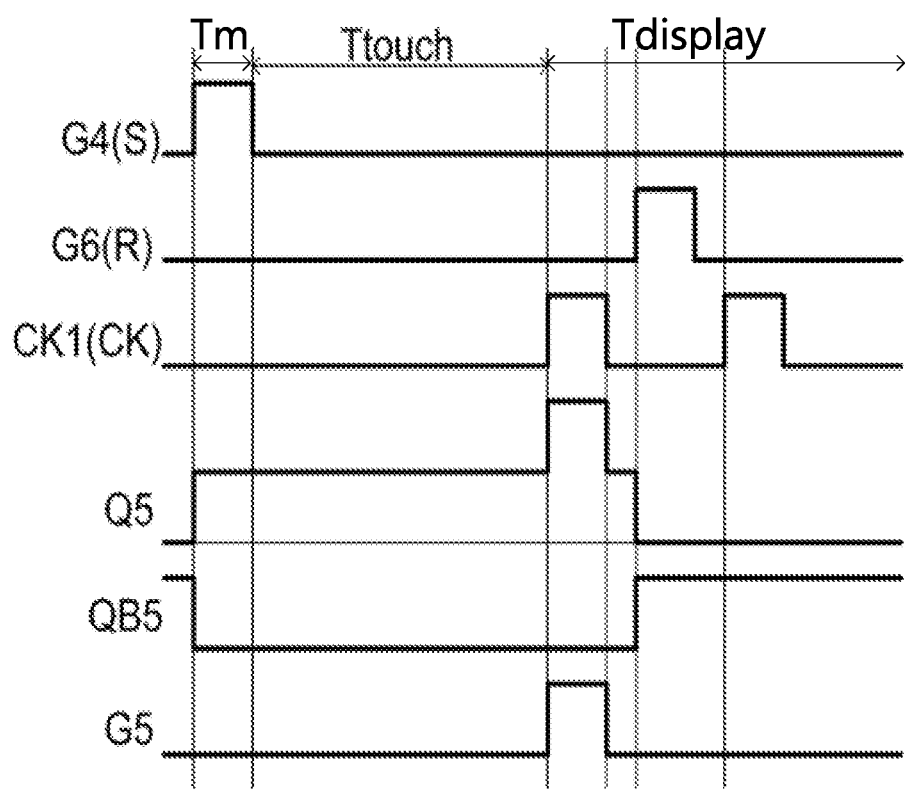
FIG. 6 is a time sequence diagrammatic view of the fifth shift register unit of FIG. 5.

FIG. 6 shows a time sequence diagrammatic of the fifth shift register unit 62(5). According to the time sequence, the touch period Ttouch is occurred after the potential of the output terminal O4 decreases from the high level voltage to the low level voltage during the display period Tdisplay, in the touch period Ttouch, the FF circuit 880 is in the hold state, which causes the potential of the internal terminal Q5 to be held in the first level voltage during the period Tm, and the potential of the internal inverted terminal QB to be held in the low level voltage during the period Tm, the pulse signal outputted by the fifth shift register unit 62(5) applied to the gate line G5 is the low level voltage. When entering a next display period Tdisplay, the potential of the first clock signal CK1 increases from the low level voltage to the high level voltage, the potential of the internal terminal Q5 is boosted from the first level voltage to the second level voltage, which is greater than the first level voltage, and the pulse signal of the shift register unit 62(5) applied to the gate line G5 increases from the low level voltage to the high level voltage.

As described above, based on the static FF circuit 810 of this embodiment, the potential of the internal terminal Q and the inverted internal terminal QB do not change even if the operation cycle changes. For this reason, it is possible to prevent occurrence of defects such as horizontal lines, and a performance of the touch display panel is improved.

Figure 7:
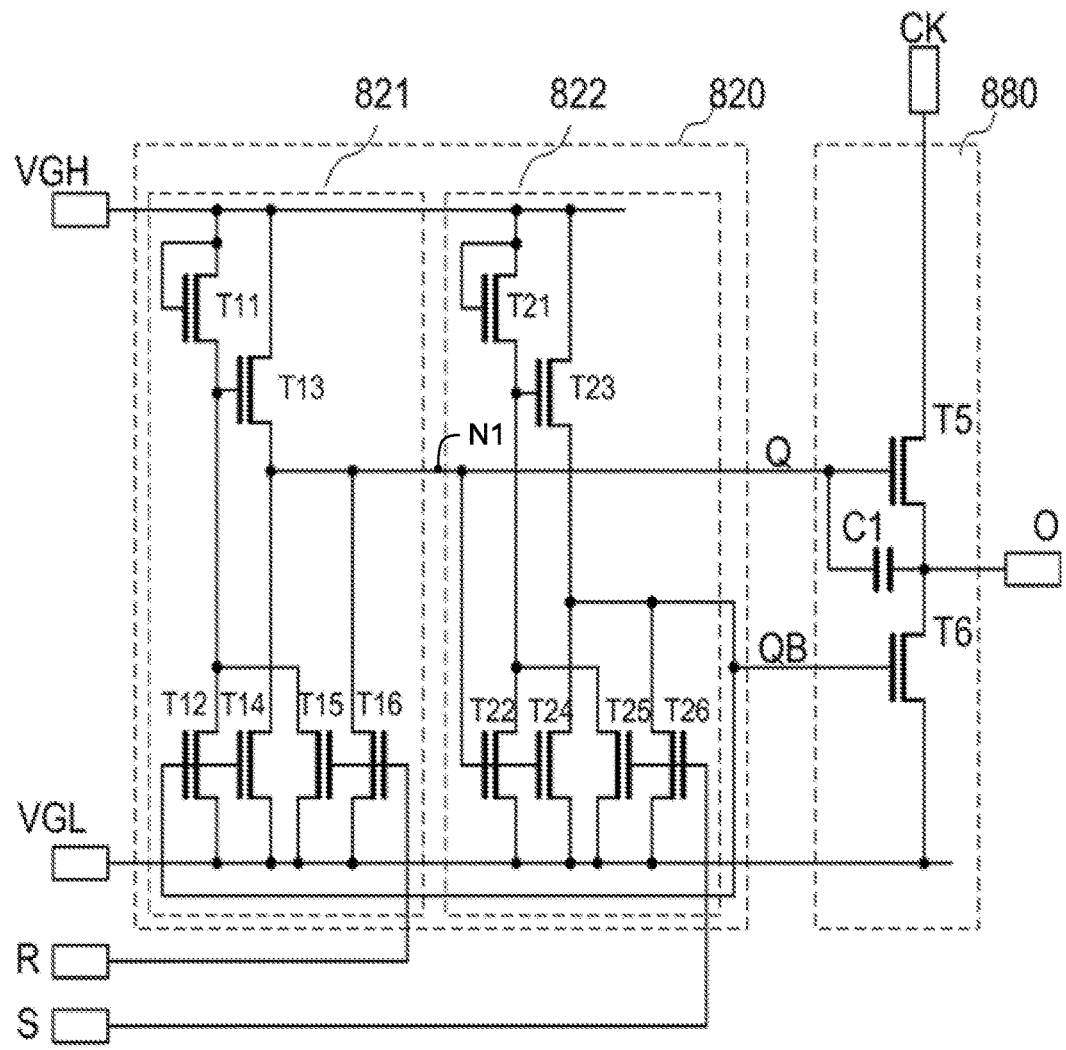
FIG. 7 is a circuit diagrammatic view of a second exemplary embodiment of the shift register unit of FIG. 2.

FIG. 7 illustrates a circuit diagrammatic view of a second embodiment of the shift register unit 62b. In the embodiment, the static FT circuit 820 is different from the static FF circuit 810. The static FF circuit 820 operates between a first state, a second state, and a hold state. When the static FF circuit 820 operates in the first state, the signal outputted by the internal terminal Q is in a high level voltage, and the signal outputted by the internal inverted terminal QB is in a low level voltage; when the static FF circuit 820 operates in the second state, the signal outputted by the internal terminal Q is in the low level voltage, and the signal outputted by the internal inverted terminal QB is in the high level voltage; when the static FF circuit 820 operates in the hold state, the signal outputted by the internal terminal Q remains the potential. In the exemplary embodiment, the static FF circuit 820 holds the potentials of the internal terminal Q and the internal inverted terminal QB during a touch period Ttouch to be same as potentials of an adjacent time in an anterior display period Tdisplay before the touch period Ttouch.

The first inverted circuit 821 includes the first transistor T11, a second transistor T12, a fourth transistor T13, a fifth transistor T14, a sixth transistor T15, and a seventh transistor T16. The first transistor T11, the second transistor T12, the fourth transistor T13, and the fifth transistor T14 form an inverted circuit to instead of the first transistor T11 and the second transistor T12 in the FF circuit 810, and the sixth transistor T15 and the seventh transistor T16 are used as a reset circuit to instead of the third transistor T17 in the FF circuit 810. The first transistor T11 and the second transistor T12 cooperate to hold the potential of the internal terminal Q in the touch period Ttouch to be equal to the potential of the internal terminal Q in the time Tm of the anterior display period Tdisplay, which is adjacent to the touch period Ttouch. In the first inverted circuit 821, a gate electrode of the first transistor T11 is electrically connected to a source electrode of the first transistor T11, the source electrode of the first transistor T11 is electrically connected to the first power line VGH, and a drain electrode of the first transistor T11 is electrically connected to a source electrode of the second transistor T12. Gate electrodes of the second transistor T12 and the fifth transistor T14 as the internal inverted terminal QB are connected to each other, and further connected to the gate electrode of the pull-up transistor T5. Source electrodes of the second transistor T12 and the sixth transistor T15 are connected to each other, and are further connected to the drain electrode of the first transistor T11. Drain electrodes of the second transistor T12, the fifth transistor T14, the sixth transistor T15, and the sixth transistor T16 are connected to each other, and are further connected to the second power line VGL respectively. Gate electrodes of the sixth transistor T15 and the seventh transistor T16 are connected to each other, and further receive the reset signal R respectively. A gate electrode of the fourth transistor T13 is electrically connected to the drain electrode of the first transistor T11, a source electrode of the fourth transistor T13 is electrically connected to the first power line VGH, and a drain electrode of the fourth transistor T13 as the internal terminal Q is electrically connected to a source electrode of the fifth transistor T14 and the gate electrode of the pull-up transistor T5. A source electrode of the seventh transistor T16 is electrically connected to the source electrode of the fourth transistor T13. A source electrode of the sixth transistor T15 is electrically connected to the gate electrode of the fourth transistor T13.

In the second inverted circuit 821, the first transistor T21, the second transistor T22, the fourth transistor T23, and the fifth transistor T24 form an inverted circuit to instead of the first transistor T11 and the second transistor T12 in the FF circuit 810, and the sixth transistor T25 add the seventh transistor T26 are used as a reset circuit to instead of the third transistor T27 in the FF circuit 810. The first transistor T21 and the second transistor T22 cooperate to hold the potential of the internal inverted terminal QB in the touch period Ttouch to be equal to the potential of the internal inverted terminal QB in the time Tm of the anterior display period Tdisplay, which is adjacent to the touch period Ttouch. A gate electrode of the first transistor T21 is electrically connected to a source electrode of the first transistor T21, the source electrode of the first transistor T21 is electrically connected to the first power line VGH, and a drain electrode of the first transistor T21 is electrically connected to a source electrode of the second transistor T22. The gate electrodes of the second transistor T22 and the fifth transistor T24 are electrically connected to the gate electrode of the pull-up transistor T5. The gate electrodes of the sixth transistor T25 and the seventh transistor T26 are connected to each other, and further receive the setting signal S. The drain electrode of the fourth transistor T23 is connected to the gate electrode of the pull-down transistor T6. The source electrodes of the sixth transistor T25 and the seventh transistor T26 are connected to each other, and are further electrically connected to the gate electrode of the pull-down transistor T6 respectively. Drain electrodes of the second transistor T22, the fifth transistor T24, the sixth transistor T25, and the sixth transistor T26 are connected to each other, and are further connected to the second power line VGL respectively.

As the described above, based on the static FF circuit 810 of this embodiment, the potential of the internal terminal Q and the inverted internal terminal QB do not change even if the operation cycle changes. For this reason, it is possible to prevent occurrence of defects such as horizontal lines, and a performance of the touch display panel is improved. Further, the shift register units with the static FF circuits are capable of using in a high frequency signal circuit, an output resistance of the shift register circuit is possible to decrease, and a gain of the shift register circuit is possible to increase.

Figure 8:
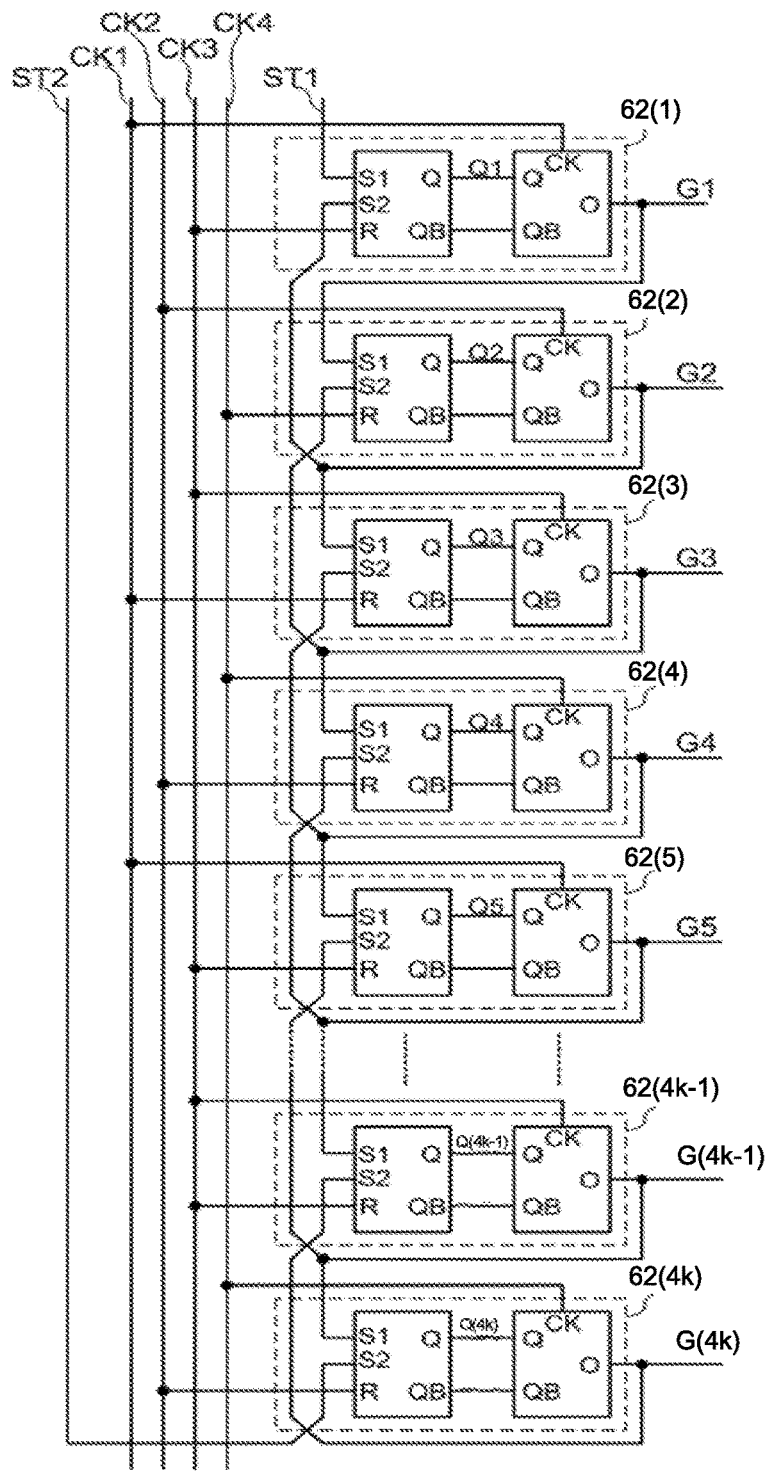
FIG. 8 is a circuit diagrammatic view of a second exemplary embodiment of the first shift register circuit of FIG. 1, the first shift register circuit comprises a plurality of shift register units.

FIG. 8 illustrates a circuit diagrammatic view of a second embodiment of the shift register circuit 700 in the first driving circuit 310 and the second circuit 320. The difference between the shift register circuit 700 and the shift register circuit 600 will described as follow. The shift register circuit 700 is a bidirectional shift register circuit. The shift register circuit 700 can operates in a forward manner for sequentially scanning the gate lines G1-G4k in an arranged manner and can operates in a reverse manner for sequentially scanning the gate lines G4k-G1 in a reverse arranged manner. The shift register circuit 700 is electrically connected to the clock lines (not shown) to receive the clock signals CK1-CK4, and further is electrically connected to scan start lines (not shown) to receive a first scan start signal ST1 and a second scan start signal ST2. The first scan start signal ST1 recites the forward manner of the shift register circuit 700, and the second scan start signal ST2 recites the reverse manner of the shift register circuit 700. The shift register circuit 700 includes a plurality of shift register units 62(1)-62(4k), k is an even number. Each of the shift register units 62 receives a first scan start signal S1, a second scan start signal S2, a reset signal R, a clock signal CK, and includes an output terminal O. Each odd numbered shift register units 62 receives the odd clock signals CK1, CK3. One of the received odd clock signals CK1, CK3 of the odd numbered shift register units 62 is served as the reset signal R, and the other of the received odd clock signals CK1, CK3 of the odd numbered shift register units 62 is served as the clock signal. One of the received connected even clock signals CK2, CK4 of the even numbered shift register units 62 is served as the reset signal R, and the other of the received even clock signals CK2, CK4 of the even numbered shift register units 62 is served as the clock signal CK. The first shift register unit 62(1) receives the first scan start signal ST1 as the first setting signal S1, and the last first shift register unit 62(4k) receives the second scan start signal ST2 as the second setting signal S2. The pulse signal of the output terminal O of the second shift register unit 62(2) is applied to the first shift register unit 62(1) as the second setting signal S2. The pulse signal of the output terminal O of the shift register unit 62(p) is applied to the following adjacent shift register unit 62(p+1) as the first setting signal S1, and further applied to the anterior adjacent shift register unit 62(p−1) as the second setting signal S2, where p is an integer not less than four, and less than k.

The first shift register unit 62(1) receives the first scan start signal ST1 as the first scan start signal S1, receives the first clock signal CK1 as the clock signal, receives the pulse signal outputted by the second shift register unit 62(2) as the second scan start signal S2, receives the third clock signal CK3 as the reset signal R, and outputs the pulse signal through the output terminal O of the first shift register unit 62(1). The second shift register unit 62(2) receives the pulse signal outputted by the first shift register unit 62(1) as the first scan start signal S1, receives the pulse signal outputted by the third shift register unit 62(3) as the second scan start signal S2, receives the second clock signal CK2 as the clock signal, receives the clock signal CK4 as the reset signal R, and outputs the pulse signal through the output terminal O of the second shift register unit 62(2). The pulse signal outputted by the second shift register unit 62(2) is applied to the gate line G2, and is further provided to the first shift register unit 62(1) as the second scan start signal S2. Likewise, the Pth shift register unit 62(p) receives the pulse signal outputted by the (P−1)th shift register unit 62(p−1) as the first setting signal S1, receives one of the clock signals CK1-CK4 as the clock signal, receives one of the clock signals CK1-CK4 as the reset signal R, and further generates the pulse signal through the output terminal O of the Pth shift register unit 62(p). The pulse signal of the Pth shift register unit 62(p) is applied to the gate line Gp, and is further provided to the (P+1)th shift register unit 62(p+1) as the second setting signal S2.

Figure 9:
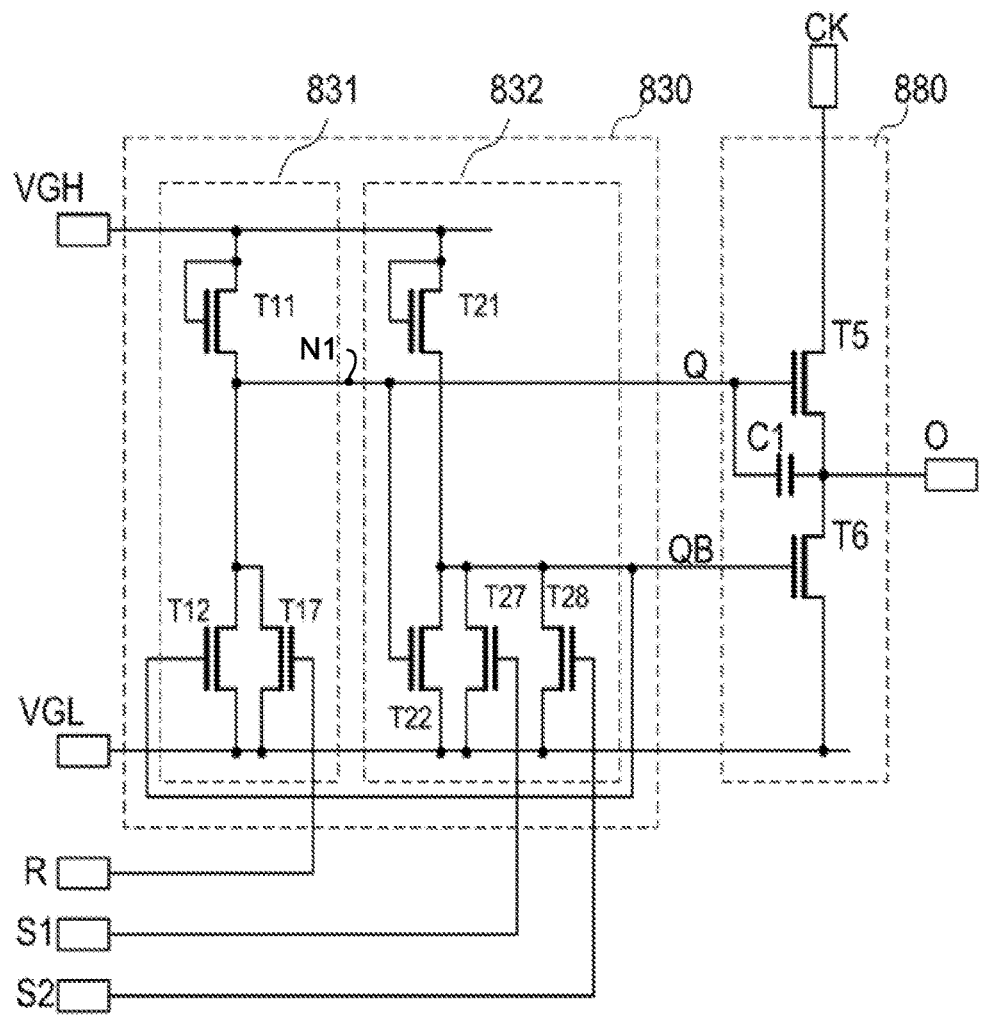
FIG. 9 is a circuit diagrammatic view of a third exemplary embodiment of the shift register unit of FIG. 8.

FIG. 9 illustrates a circuit diagrammatic view of a third embodiment of the shift register unit 62c. The shift register unit 62c receives a first scan start signal S1 and a second scan start signal S2. The shift register unit 62c is similar to the shift register unit 62a, the difference between the shift register unit 62c and the shift register unit 62a is the second inverted circuit 832. The second inverted circuit 832 further includes a fourth transistor T28. The fourth transistor T28 is used as a reverse set transistor. The gate electrode of the third transistor T27 receives the first scan start signal S1. A gate electrode of the fourth transistor T28 receives the second scan start signal S2, a source electrode of the fourth transistor T28 is electrically connected to the gate electrode of the pull-down transistor T6, and a drain electrode of the fourth transistor T28 is electrically connected to the second power line VGL.

Figure 10:
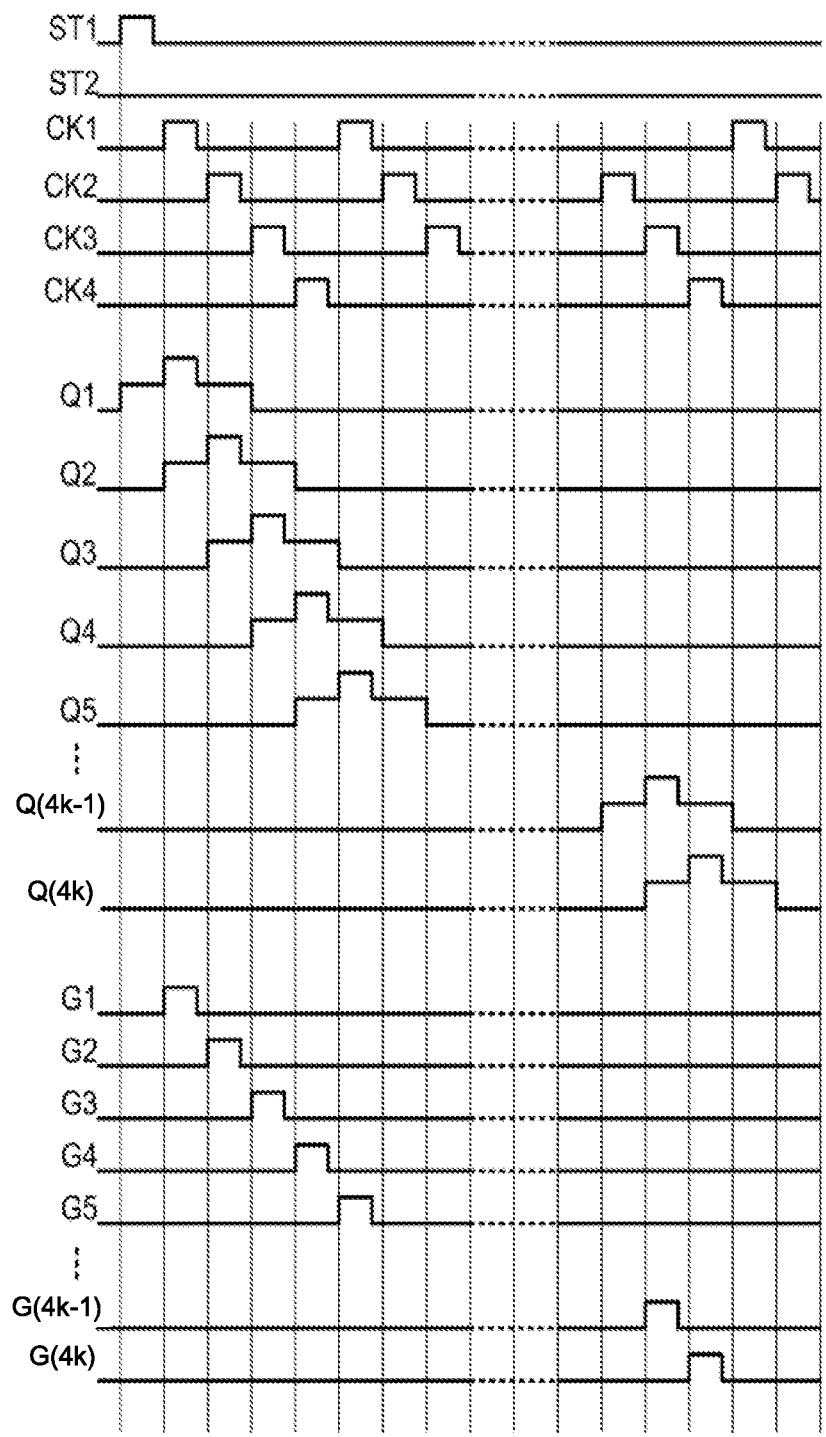
FIG. 10 is a time sequence diagrammatic view the shift register circuit of FIG. 9 for applying the pulse signals in a forward direction.

FIG. 10 illustrates a time sequence diagrammatic of the shift register circuit 700 of FIG. 9 for applying the pulse signals in the forward direction. When the potential of the first scan start signal ST1 increases from the low level voltage to the high level voltage, the pulse signal outputted by the second shift register unit 62(2) is in the low level voltage, and the third clock signal CK3 is in the low level voltage, the potential of the internal terminal Q1 of the shift register unit 62(1) increases from the low level voltage to the first level voltage, and the first capacitor C1 is being charged. The potential of the output terminal O applied to the first gate line G1 is the same as the clock signal CK1 in a low level voltage. When the potential of the first scan start signal ST1 decreases from the high level voltage to the low level voltage, the FF circuit 830 is in the hold state, the potential of the internal terminal Q1 is in the first level voltage and the internal inverted terminal QB1 is in the low level voltage. When the potential of the clock signal CK1 increases from the low level voltage to the high level voltage, the potential of the internal terminal Q1 of the shift register unit 62(1) being boosted increases from the first level voltage to the second level voltage, and the pulse signal of the output terminal O of the shift register unit 62(1) applied to the gate line G1 increases from the low level voltage to the high level voltage, the pulse signal of the first shift register unit 62(1) is further applied to the second shift register unit 62(2) as the first set signal S1. The first shift register unit 62(1) receives the clock signal CK3 as the reset signal R. Meanwhile, the potential of the internal terminal Q2 of the shift register unit 62(2) increases from the low level voltage to the first level voltage. When the potential of the clock signal CK2 increases from the low level voltage to the high level voltage, the potential of the internal terminal Q2 of the shift register unit 62(2) being boosted increases from the first level voltage to the second level voltage, and the pulse signal of the output terminal O of the shift register unit 62(2) applied to the gate line G2 increases from the low level voltage to the high level voltage, the pulse signal of the second shift register unit 62(2) is further applied to the third shift register unit 62(3) as the first set signal S1. The second shift register unit 62(2) receives the clock signal CK4 as the reset signal R. Meanwhile, the potential of the internal terminal Q3 of the shift register unit 62(3) increases from the low level voltage to the first level voltage. Likewise, the reset shift register units 62(3)-62(4) works in a same way. Thus, the shift register circuit 700 operates in the forward manner.

Figure 11:
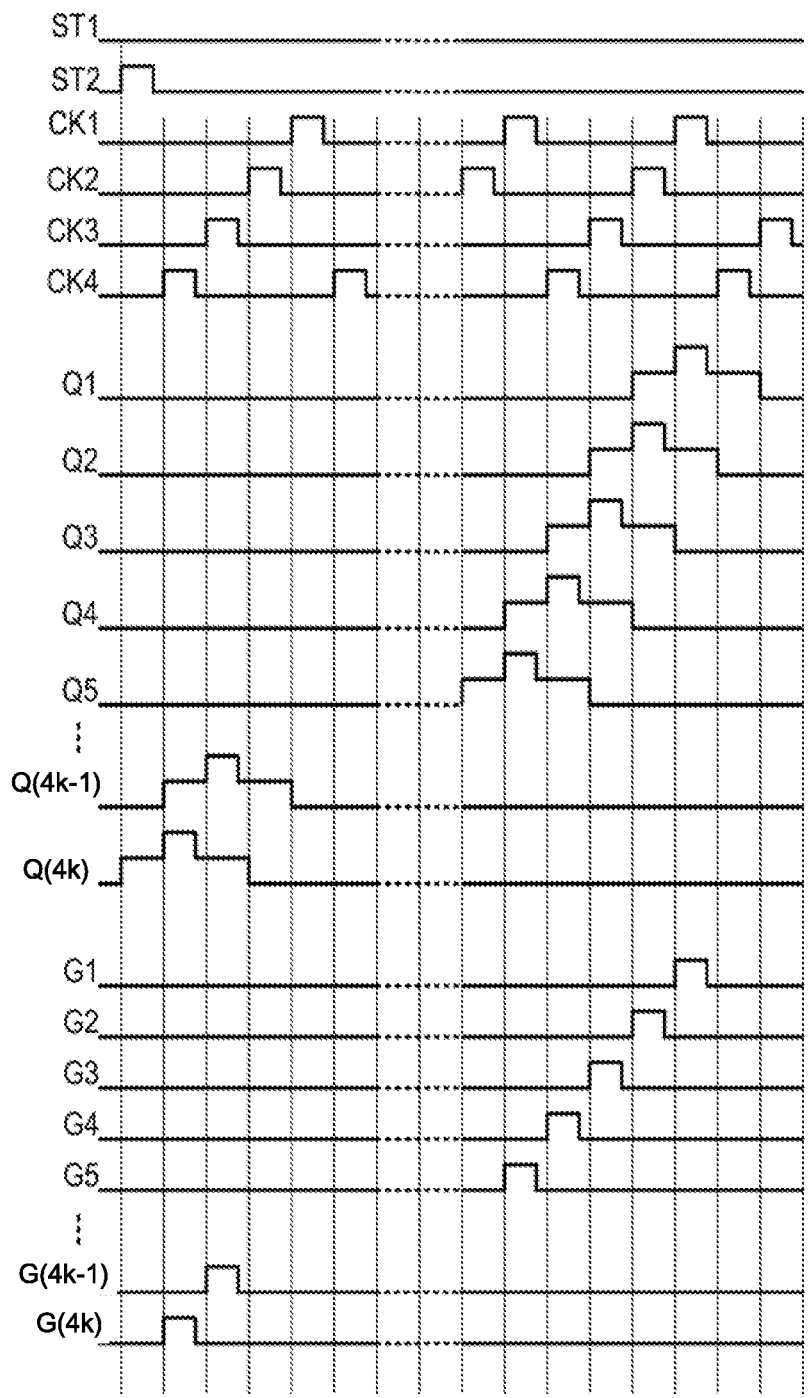
FIG. 11 is a time sequence diagrammatic view the shift register circuit of FIG. 9 for applying the pulse signals in a reverse direction.

FIG. 11 illustrates a time sequence diagrammatic of the shift register circuit 700 for applying the pulse signals in the reverse direction. When the potential of the second setting signal ST2 increases from the low level voltage to the high level voltage, the potential of the pulse signal outputted by the shift register unit Q(4k−1) is in the low level voltage, and the potential of the clock signal CK4 is in the low level voltage, the potential of the internal terminal Q(4k) of the shift register unit 62(4k) increases from the low level voltage to the first level voltage, and the first capacitor C1 is being charged. The potential of the output terminal O applied to the gate line G4k is the same as the clock signal CK4 in a low level voltage. When the potential of the second scan start signal ST2 decreases from the high level voltage to the low level voltage, the FF circuit 830 is in the hold state, the potential of the internal terminal Q4k is in the first level voltage and the internal inverted terminal QB4k is in the low level voltage. When the potential of the clock signal CK4 increases from the low level voltage to the high level voltage, the potential of the internal terminal Q(4k) of the shift register unit 62(4k) being boosted increases from the first level signal to the second level signal, and the potential of the pulse signal outputted by the output terminal O of the shift register unit 62(4k) applied to the gate line G(4k) increases from the low level voltage to the high level voltage, the pulse signal of the shift register unit 62(4k) is further applied to the shift register unit 62(4k−1) as the second set signal S2. The shift register unit 62(4k) receives the clock signal CK2 as the reset signal R. Meanwhile, the potential of the internal terminal Q(4k−1) of the shift register unit 62(4*k*–1) increases from the low level voltage to the first level voltage. When the potential of the clock signal CK3 increases from the low level voltage to the high level voltage, the potential of the internal terminal Q(4*k*–1) of the shift register unit 62(4*k*–1) being boosted increases from the first level voltage to the second level voltage, and the potential of the pulse signal outputted by the output terminal O of the shift register unit 62(4*k*–1) applied to the gate line G(4*k*–1) increases from the low level voltage to the high level voltage, the pulse signal of the shift register unit 62(4*k*–1) is further applied to the shift register unit 62(4*k*–2) as the second set signal S2. The shift register unit 62(4*k*–1) receives the clock signal CK1 as the reset signal R. Likewise, the pulse signals of the shift register units 62 are sequentially applied to the gate lines G4*k*-G1 in an inverse direction from the gate line G4*k* to the gate line G1.

As the described above, based on the static FF circuit 810 of this embodiment, the potential of the internal terminal Q and the inverted internal terminal QB do not change even if the operation cycle changes. For this reason, it is possible to prevent occurrence of defects such as horizontal lines, and a performance of the touch display panel is improved. Further, the shift register circuit is a bidirectional shift register circuit, which can apply pulse signals in the forward direction or in the reverse direction.

Figure 12:
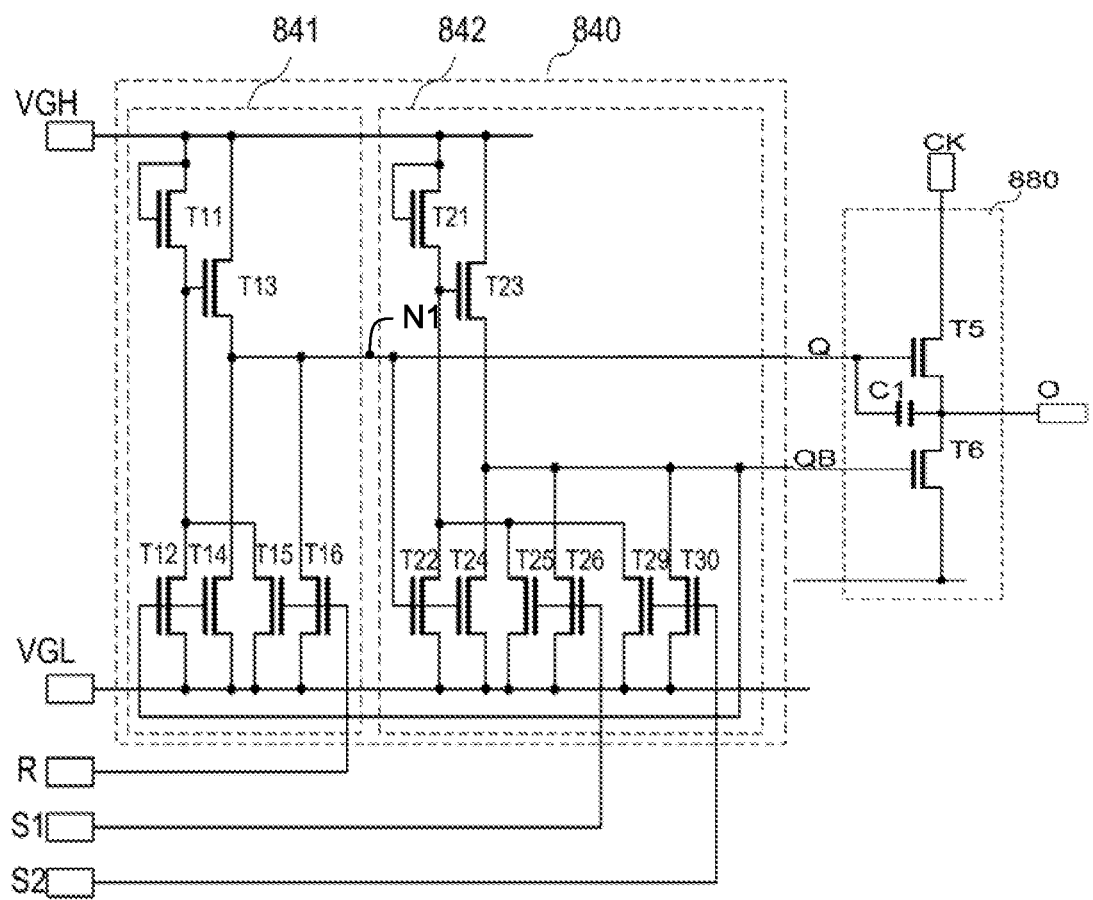
FIG. 12 is a circuit diagrammatic view of a fourth exemplary embodiment of the shift register unit of FIG. 9.

FIG. 12 illustrates a circuit diagrammatic view of a fourth embodiment of the shift register unit 62*d*. The shift register circuit 62*d* is a bidirectional shift register circuit, which likes the shift register circuit 62*c* in the third embodiment. The static FF circuit 840 receives a first set signal S1, a second set signal S2, a reset signal R, and controls the potential of the internal terminal Q and the internal inverted terminal QB. The static FF circuit 840 operates between a first state, a second state, and a hold state. When the static FF circuit 840 operates in the first state, the signal outputted by the internal terminal Q is in a high level voltage, and the signal outputted by the internal inverted terminal QB is in a low level voltage; when the static FF circuit 840 operates in the second state, the signal outputted by the internal terminal Q is in the low level voltage, and the signal outputted by the internal inverted terminal QB is in the high level voltage; when the static FF circuit 840 operates in the hold state, the signal outputted by the internal terminal Q remains the potential. In the exemplary embodiment, the static FF circuit 840 holds the potentials of the internal terminal Q and the internal inverted terminal QB during a touch period Ttouch to be same as potentials of an adjacent time in an anterior display period Tdisplay before the touch period Ttouch.

The first static inverted circuit 841 includes the first transistor T11, a second transistor T12, a fourth transistor T13, a fifth transistor T14, a sixth transistor T15, and a seventh transistor T16. The first transistor T11, the second transistor T12, the fourth transistor T13, and the fifth transistor T14 form an inverted circuit, and the sixth transistor T15 and the seventh transistor T16 are used as a reset circuit. The electrically connection of the first static inverted circuit 41 is same as the first static inverted circuit 821, and the electrically connection of the second static inverted circuit 842 is same as the second static inverted circuit 822.

In the second static inverted circuit 842 of this embodiment, the second static inverted circuit 842 further includes a ninth transistor T29 and a tenth transistor T30. The gate electrodes of sixth transistor T25 and the seventh transistor T26 are connected with each other, and further receive the first scan start signal S1 respectively. A gate electrode of the ninth transistor T29 receives the first scan start signal S1, and a gate electrode of the tenth transistor T30 receives the second scan start signal S2. Source electrodes of the ninth transistor T29 and the ninth transistor T30 are electrically connected to the gate electrode of the pull-down transistor T5, and drain electrodes of the ninth transistor T29 and the tenth transistor T30 are electrically connected to the second power line VGL.

As the described above, based on the static FF circuit 810 of this embodiment, the potential of the internal terminal Q and the inverted internal terminal QB do not change even if the operation cycle changes. For this reason, it is possible to prevent occurrence of defects such as horizontal lines, and a performance of the touch display panel is improved. Further, the shift register units with the static FF circuits are capable of using in a high frequency signal circuit, an output resistance of the shift register circuit is possible to decrease, and a gain of the shift register circuit is possible to increase. Further, the shift register circuit is a bidirectional shift register circuit, which can apply pulse signals in the forward direction or in the reverse direction.

Figure 13:
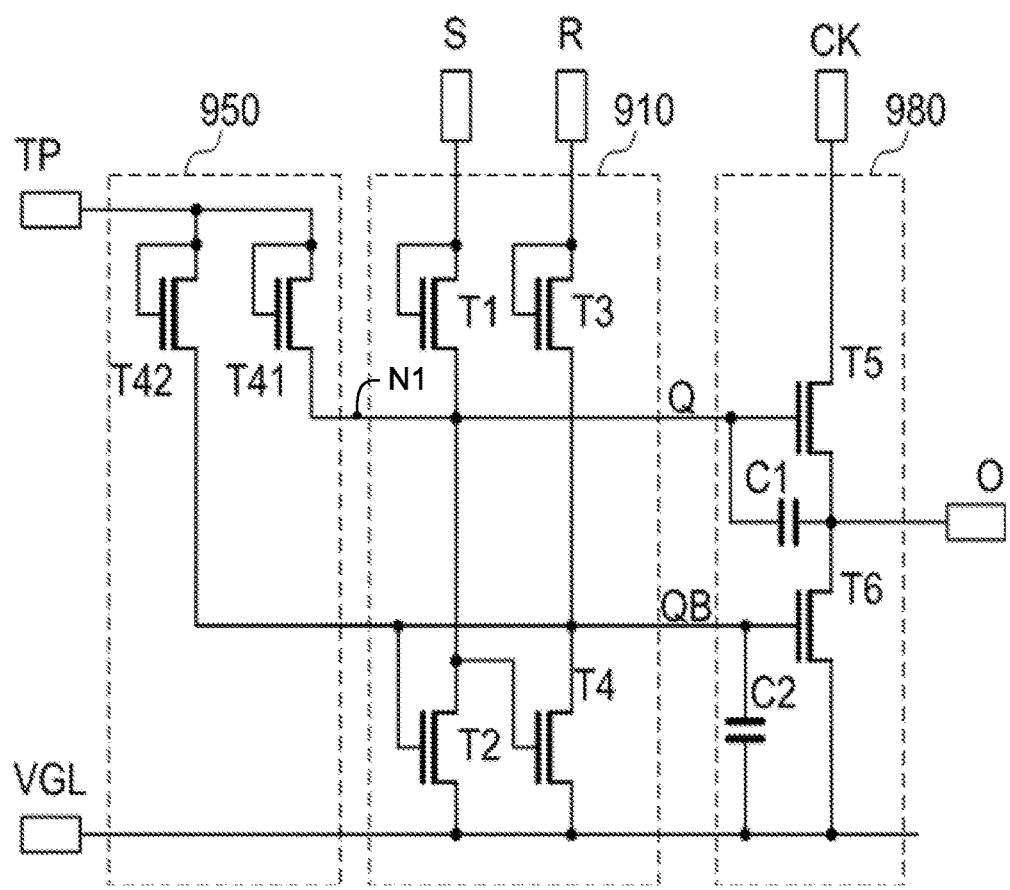
FIG. 13 is a circuit diagrammatic view of a fifth exemplary embodiment of the shift register unit of FIG. 1.
Figure 17:
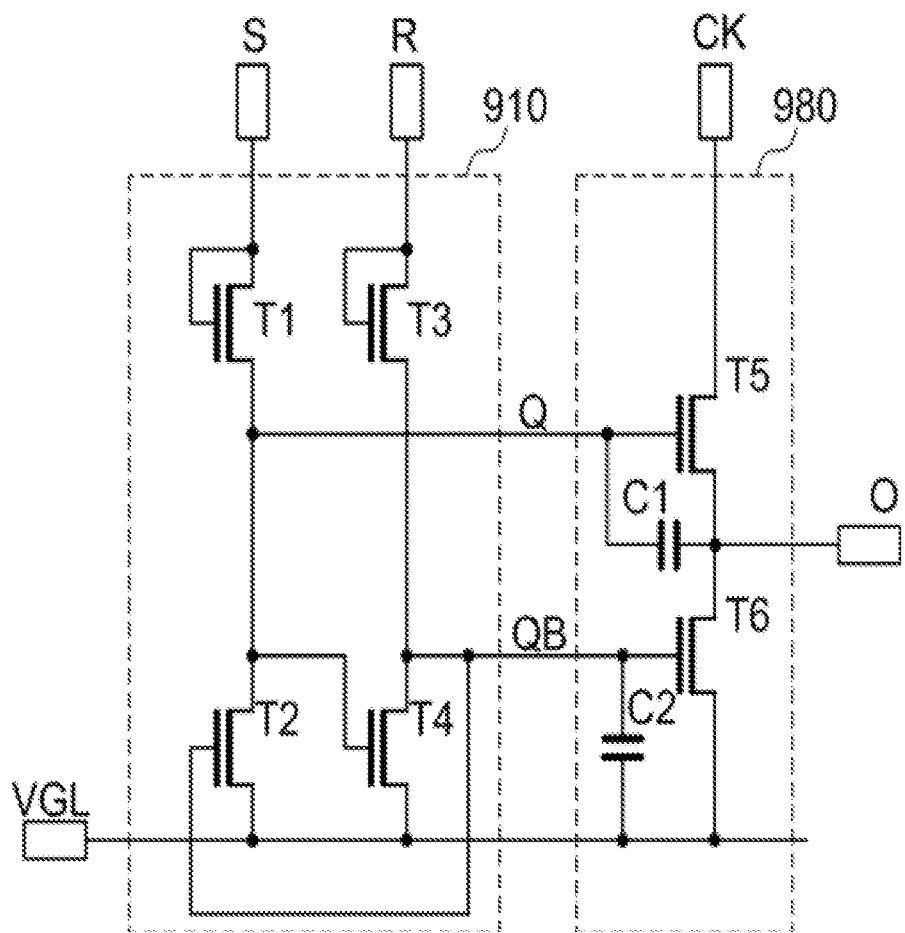
FIG. 17 is a circuit diagrammatic view of a shift register unit in a related art.
Figure 18:
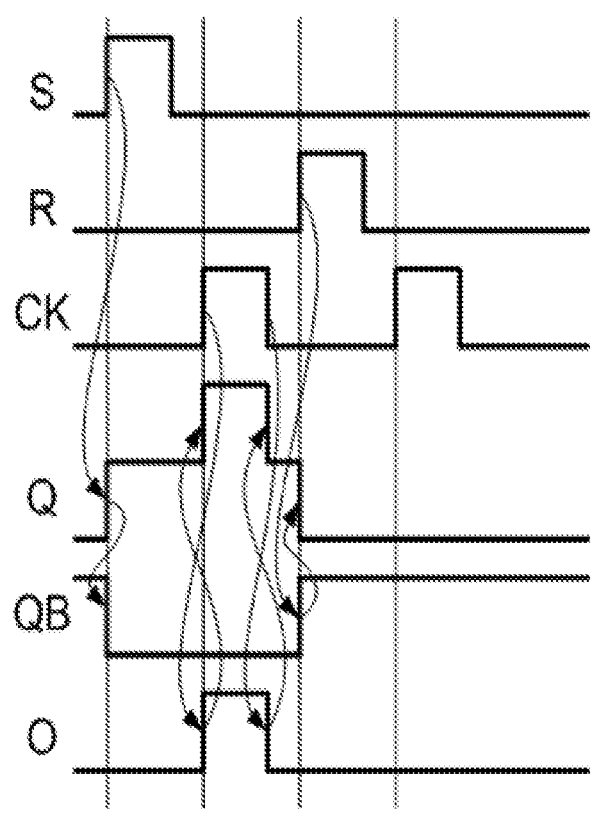
FIG. 18 is a time sequence diagrammatic view of the shift register unit of FIG. 17 in a related art.
Figure 19:
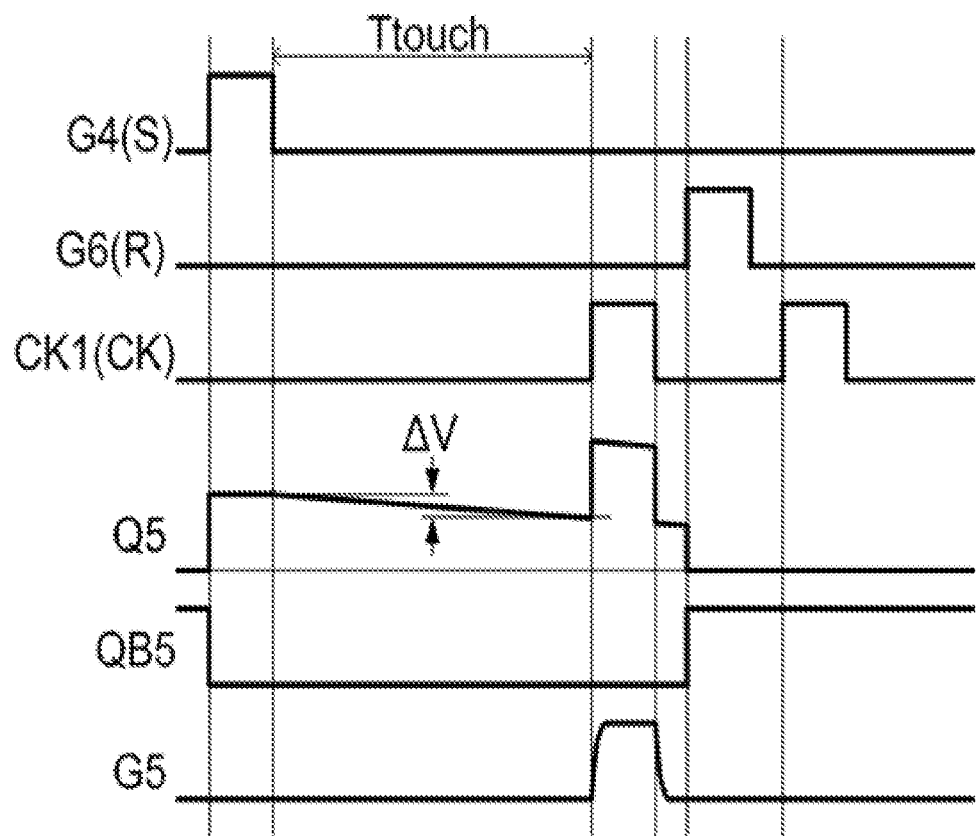
FIG. 19 is a time sequence diagrammatic view of a fifth shift register in a touch display apparatus in a related art.

FIG. 13 illustrates a circuit diagrammatic view of a fifth embodiment of the shift register unit 62*e*. The shift register unit 62*e* is different from the shifter register unit 900 (as shown in FIG. 17). The shift register unit 62*b* further receives a first touch signal TP, and further includes a control circuit 950. The control circuit 950 clamps the potential of the internal terminal Q of the inverted circuit 910 during the touch period Ttouch based on the first touch signal TP in a first level voltage. The control circuit 950 includes a first switch T41 and a second switch T42. A control terminal (gate electrode) of the first switch T41 is electrically connected to a first terminal (source electrode) of the first switch T41, and a control terminal of the fourth switch T42 is electrically connected to a first terminal (source electrode) of the second switch T42. A first terminal (source electrode) of the first switch T41 is electrically connected to the control terminal of the first switch T41, a first terminal (source electrode) of the second switch T42 is electrically connected to the control terminal of the second switch T42. The first terminals (source electrodes) of the first switch T41 and the second switch T42 are connected with each other, and further receive the first touch signal TP respectively. A second terminal (drain electrode) of the second switch T41 is electrically connected to the gate electrode of the pull-up transistor T5, and a second terminal (drain electrode) of the second switch T42 is electrically connected to the gate electrode of the pull-down transistor T6.

Figure 14:
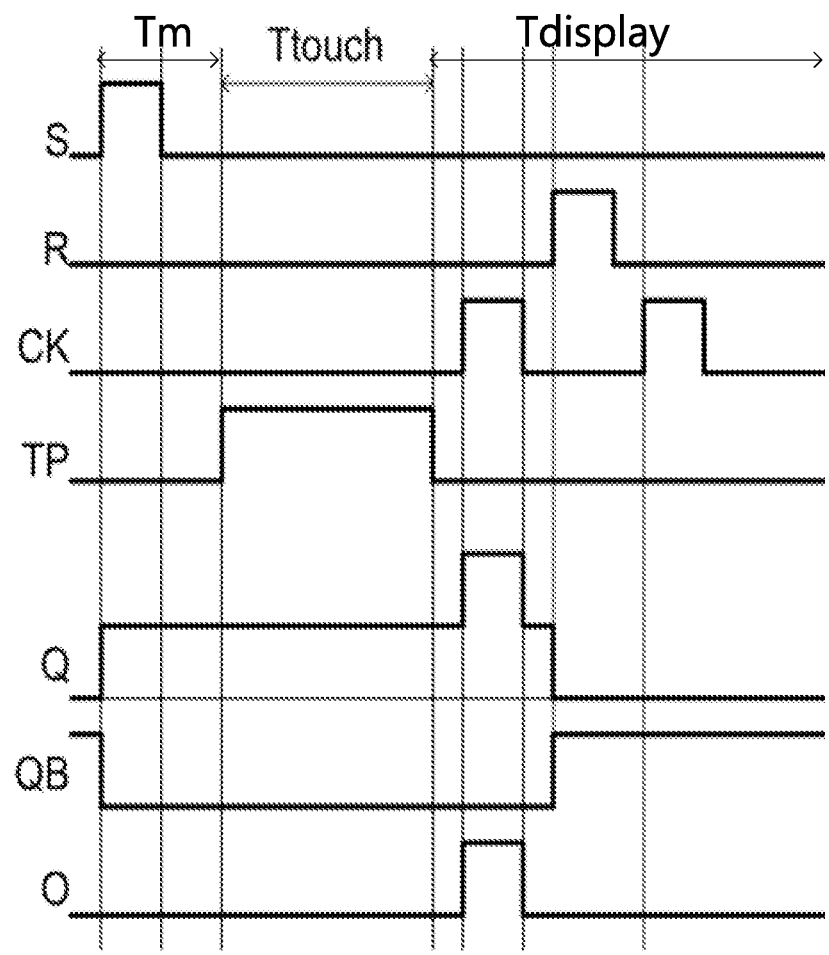
FIG. 14 is a time sequence diagrammatic view the shift register unit of FIG. 13.

FIG. 14 illustrates a time sequence diagrammatic of the shift register unit 62*e* of FIG. 13. When the potential of the scan start signal S increases from the low level voltage to the high level voltage, the reset signal R is in the low level voltage, the potential of the internal terminal Q increases from the low level voltage to the first level voltage. When the potential of the first touch signal TP increases from the low level signal to the high level signal, the touch period Ttouch begins, and the potential of the clock signal CK is in the low level voltage, the potential of the internal terminal Q clamps in the first level voltage, and the pulse signal outputted by the output terminal O of the shift register 62*b* is in the low level voltage. When the potential of the first touch signal TP decreases from the high level voltage to the low level voltage, the touch period Ttouch is completed. When the potential of the clock signal CK increases from the low level voltage to the high level voltage, the potential of the internal terminal Q being boosted increases from the first level voltage to the second level voltage, and the potential of the pulse signal outputted by the output terminal O increases from the low level voltage to the high level voltage.

As the described above, based on the control circuit 950 of this embodiment, the potential of the internal terminal Q and the inverted internal terminal QB do not change even if the operation cycle changes. For this reason, it is possible to prevent occurrence of defects such as horizontal lines, and a performance of the touch display panel is improved.

Figure 15:
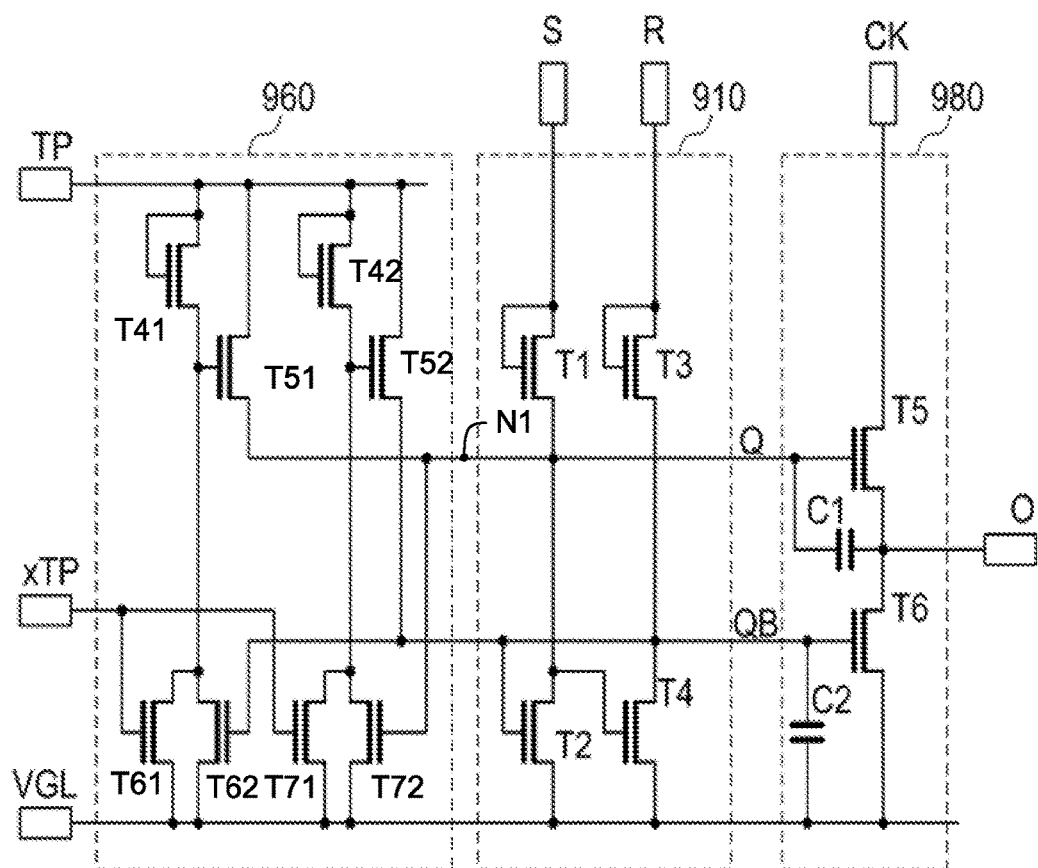
FIG. 15 is a circuit diagrammatic view of a sixth exemplary embodiment of the shift register unit of FIG. 1.

FIG. 15 illustrates a circuit diagrammatic view of a sixth embodiment of the shift register unit 62f. The shift register unit 62f further receives a second touch signal xTP. The first touch signal TP is inverted from the second touch signal xTP. The second touch signal xTP clamps the potential of the internal inverted terminal QB in the touch period Ttouch. The control circuit 960 is different from the control circuit 950. The control circuit 960 further includes a third switch T51, a fourth switch T52, a fifth switch T61, a sixth switch T62, a seventh switch T71, and an eighth switch T72. A control terminal (gate electrode) of the first switch T41 is electrically connected to a first terminal (source electrode) of the first switch T41, and a control terminal of the fourth switch T42 is electrically connected to a first terminal (source electrode) of the second switch T42. A first terminal (source electrode) of the first switch T41 is electrically connected to the control terminal of the first switch T41, a first terminal (source electrode) of the second switch T42 is electrically connected to the control terminal of the second switch T42. The first terminals (source electrodes) of the first switch T41 and the second switch T42 are connected with each other, and further receive the first touch signal TP respectively. A second terminal (drain electrode) of the first switch T41 is electrically connected to a control terminal (gate electrode) of the third switch T51, a second terminal (drain electrode) of the second switch T42 is electrically connected to a control terminal (gate electrode) of the fourth switch T52. First terminals (source electrodes) of the third switch T51 and the fourth switch T52 receive the first touch signal TP respectively. Control terminals (gate electrode) of the fifth switch T61 and the seventh switch T71 receives the second touch signal xTP respectively. A second terminal (source electrode) of the fifth switch T61 is electrically connected to the second terminal of the second switch T42. A second terminal (source electrode) of the seventh switch T71 is electrically connected to the second terminal of the first switch T41. Control terminals (gate electrodes) of the sixth switch T62 and the eighth switch T72 are electrically connected to the gate electrode of the pull-down transistor T6. A second terminal (source electrode) of the sixth switch T62 is electrically connected to the second terminal of the second switch T42. A second terminal (source electrode) of the eighth switch T72 is electrically connected to the second terminal of the first switch T41. Second terminals (drain electrodes) of the fifth switch T61, the sixth switch T62, the seventh switch T71, and the eighth switch T62 are electrically connected with each other, and are further connected to the second power line VGL respectively.

Figure 16:
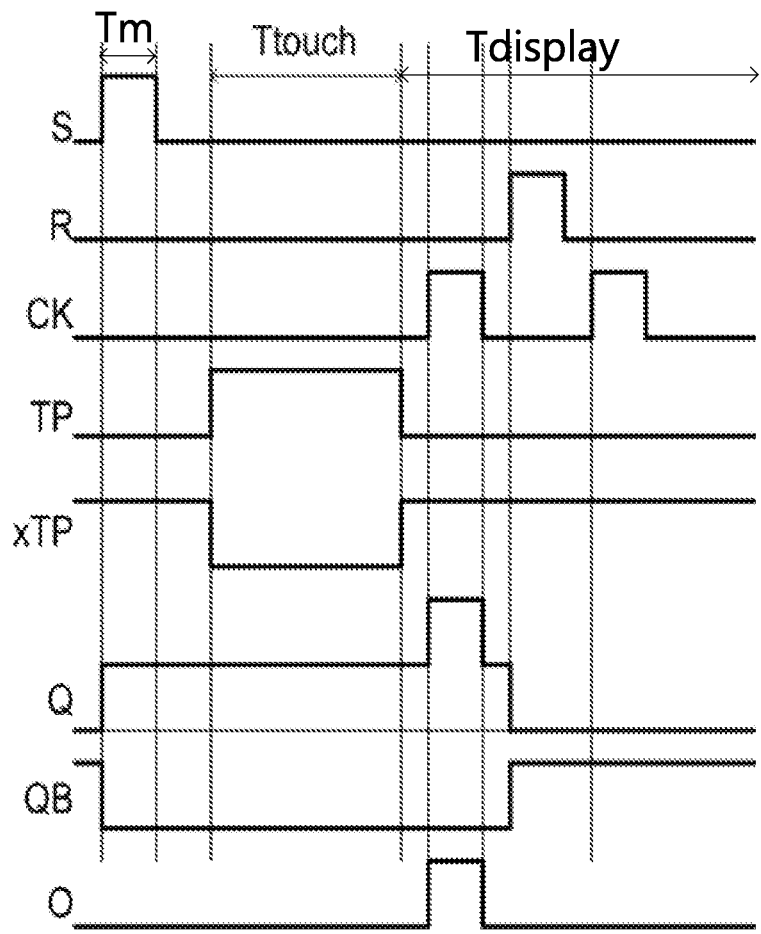
FIG. 16 is a time sequence diagrammatic view the shift register unit of FIG. 15.

FIG. 16 illustrates a time sequence diagrammatic of the shift register unit 62f of FIG. 15. When the potential of the scan start signal S increases from the low level voltage to the high level voltage, the reset signal is in the low level voltage, the potential of the internal terminal Q increases from the low level voltage to the first level voltage. When the potential of the first touch signal TP increases from the low level voltage to the high level voltage, the touch period Ttouch begins, and the potential of the second touch signal xTP decreases from the high level voltage to the low level voltage, the potential of the internal terminal Q clamps in the first level signal, and the potential of the pulse signal outputted by the output terminal O of the shift register 62c clamps in the low level voltage. When the potential of the first touch signal TP decreases from the high level voltage to the low level voltage, the potential of the second touch signal xTP increases from the low level voltage to the high level voltage, and the touch period Ttouch is completed. When the potential of the clock signal CK increases from the low level voltage to the high level voltage, the potential internal terminal Q being boosted increases from the first level voltage to the second level voltage, and the potential of the pulse signal outputted by the output terminal O increases from the low level voltage to the high level voltage.

As the described above, based on the control circuit 960 of this embodiment, the potential of the internal terminal Q and the inverted internal terminal QB do not change even if the operation cycle changes. For this reason, it is possible to prevent occurrence of defects such as horizontal lines, and a performance of the touch display panel is improved.

While various exemplary and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A shift register circuit for providing scanning signals to a plurality of gate lines of a touch display device, the touch display device operating in a display period and a touch period in turn, the shift register circuit comprising:
    a plurality of shift register units, each shift register units configured to output a pulse signal as a gate signal; each shift register unit comprising:
    a flip-flop (FF) circuit with an internal terminal and an internal inverted terminal, and configured to control potentials of the internal terminal and the internal inverted terminal based on a received setting signal and a received reset signal; and
    an output circuit configured to generate the pulse signal related to a clock signal under a control of the internal terminal and the internal inverted terminal; and
    wherein the output circuit comprises a pull-up transistor and a pull-down transistor; a gate electrode of the pull-up transistor is electrically connected to the internal terminal, and a gate electrode of the pull-down transistor is electrically connected to the internal inverted terminal; when the touch display device is operated from the display period to the touch period, the potential of the internal terminal and the potential of the internal inverted terminal remain the same as the potential in an anterior display period, which is the display period before the touch period;
    each shift register unit further comprises a control circuit the control circuit clamps the potential of the internal terminal in a first level voltage and the internal inverted terminal in a low level voltage in the anterior display period during the touch period; the FF circuit in each shift register unit is a dynamic FF circuit;
    wherein the control circuit comprises a first switch and a second switch, a control terminal of the first switch is electrically connected to a first terminal of the first switch, and a control terminal of the fourth switch is electrically connected to a first terminal of the second switch, a first terminal of the first switch is electrically connected to the control terminal of the first switch, a first terminal of the second switch is electrically connected to the control terminal of the second switch, the first terminals of the first switch and the second switch receive the first touch signal respectively, a second terminal of the second switch is electrically connected to the gate electrode of the pull-up transistor, and a second terminal of the second switch is electrically connected to the gate electrode of the pull-down transistor.

2. The shift register circuit of claim 1, wherein the FF circuit is a static FF circuit, the FF circuit is configured to operate in a first state, a second state, or a hold state; when the FF circuit operates in the first state, the potential of the internal terminal is in a high level voltage, and the potential of the internal inverted terminal is in a low level voltage; when the FF circuit operates in the second state, the potential of the internal terminal is in the low level voltage, and the potential of the internal inverted terminal is in the high level voltage; when the FF circuit operates in the hold state, the potentials of the internal terminal and the internal inverted terminal are constant to be same as a previous state; the FF circuit is in the hold state during the touch period.

3. The shift register circuit of claim 2, wherein the FF circuit in the first shift register unit receives a scan start signal as the setting signal, and receives the pulse signal outputted by a following adjacent shift register unit as the reset signal; and the FF circuit in each rest shift register unit receives the pulse signal outputted by a previous adjacent shift register unit as the setting signal, and receives the pulse signal outputted by a following adjacent shift register unit as the reset signal.

4. The shift register circuit of claim 3, wherein the FF circuit comprises a first static inverted circuit and a second static inverted circuit; the first static inverted circuit receives the reset signal and resets the potential of the internal terminal to the low level voltage and the internal inverted terminal to the high level voltage; the second static inverted circuit receives the set signal and sets the potential of the internal terminal to the first level voltage and the potential of the inverted signal to the low level voltage.

5. The shift register circuit of claim 3, wherein each of the first static inverted circuit and the second static inverted circuit comprises a first transistor, a second transistor, and a third transistor; in the first static inverted circuit, the first transistor and the second transistor works as an inverter circuit, and the third transistor is served as a reset transistor; in the second static inverted circuit, the first transistor and the second transistor works as an inverter circuit, and the third transistor is served as a set transistor.

6. The shift register circuit of claim 2, wherein the shift register circuit is a bidirectional shift register circuit, and is selectively operated in a forward direction and a reverse direction for sequentially applying the pulse signals to the gate lines; each shift register unit receives two clock signal, a first scan start signal, and a second scan start signal; one of the two clock signal is applied to the FF circuit as the reset signal, and the other of the two clock signal is applied to the output circuit.

7. The shift register circuit of claim 6, wherein when the shift register circuit operates in the forward direction, the first scan start signal is applied with a pulse signal; when the shift register circuit operates in the reverse direction, the second scan start signal is applied with a pulse signal.

8. The shift register circuit of claim 6, wherein the FF circuit comprises a first static inverted circuit and a second static inverted circuit; the first static inverted circuit receives the reset signal and resets the potential of the internal terminal to the low level voltage and the internal inverted terminal to the high level voltage; the second static inverted circuit receives the set signal and sets the potential of the internal terminal to the first level voltage and the potential of the inverted signal to the low level voltage.

9. The shift register circuit of claim 1, wherein the control circuit further receives a second touch signal, the first touch signal is inverted with the second touch signal; the second touch signal clamps the potential of the internal inverted terminal.

10. A touch display apparatus operating in a display period and a touch period in turn, the touch display apparatus comprising:
   a plurality of gate lines located in a display region;
   a plurality of data lines located in the display region and crossed with the gate lines to define a plurality of pixels; and
   at least one gate driving circuit located in a non-display region surrounded with the display region, and configured to sequentially apply pulse signals to the gate lines for driving the pixel;
   wherein each of the at least one gate driving circuit comprises a plurality of shift register units; each shift register unit generates the pulse signal to the corresponding gate line as a gate signal, a following adjacent shift register unit, and an anterior adjacent shift register unit; each shift register unit comprises a flip-flop (FF) circuit and an output circuit; the FF circuit comprises an internal terminal and an internal inverted terminal; the FF circuit controls potentials of the internal terminal and the internal inverted terminal based on a received a setting signal and a received reset signal, the output circuit generates the pulse signal related to a clock signal under a control of the internal terminal and the internal inverted terminal; the output circuit comprises a pull-up transistor and a pull-down transistor; a gate electrode of the pull-up transistor is electrically connected to the internal terminal, and a gate electrode of the pull-down transistor is electrically connected to the internal inverted terminal; when the touch display apparatus is operated in the touch period, the potential of the internal terminal and the potential of the internal inverted terminal remain the same as the potential in an anterior display period, which is the display period before the touch period;
   each shift register unit further comprises a control circuit the control circuit clamps the potential of the internal terminal in a first level voltage and the internal inverted terminal in a low level voltage in the anterior display period during the touch period; the FF circuit in each shift register unit is a dynamic FF circuit;
   wherein the control circuit comprises a first switch and a second switch, a control terminal of the first switch is electrically connected to a first terminal of the first switch, and a control terminal of the fourth switch is electrically connected to a first terminal of the second switch, a first terminal of the first switch is electrically connected to the control terminal of the first switch, a first terminal of the second switch is electrically connected to the control terminal of the second switch, the first terminals of the first switch and the second switch receive the first touch signal respectively, a second terminal of the second switch is electrically connected to the gate electrode of the pull-up transistor, and a second terminal of the second switch is electrically connected to the gate electrode of the pull-down transistor.

11. The touch display apparatus of claim 10, wherein the touch display apparatus comprises a first gate driving circuit and a second gate driving circuit, which are symmetrically located on opposite sides of the display region; the first gate driving circuit applies the pulse signals to the gate lines in odd rows, the second gate driving circuit applies the pulse signals to the gate lines in even rows.

12. The touch display apparatus of claim 10, wherein the FF circuit is a static FF circuit, the FF circuit is configured to operate in a first state, a second state, or a hold state; when the FF circuit operates in the first state, the potential of the internal terminal is in a high level voltage, and the potential of the internal inverted terminal is in a low level voltage; when the FF circuit operates in the second state, the potential of the internal terminal is in the low level voltage, and the potential of the internal inverted terminal is in the high level voltage; when the FF circuit operates in the hold state, the potentials of the internal terminal and the internal inverted terminal are constant to be same as a previous state; the FF circuit is in the hold state during the touch period.

13. The touch display apparatus of claim 12, wherein the FF circuit in the first shift register unit receives a scan start signal as the setting signal, and receives the pulse signal outputted by a following adjacent shift register unit as the reset signal; and the FF circuit in each rest shift register unit receives the pulse signal outputted by a previous adjacent shift register unit as the setting signal, and receives the pulse signal outputted by a following adjacent shift register unit as the reset signal.

14. The touch display apparatus of claim 13, wherein the FF circuit comprises a first static inverted circuit and a second static inverted circuit; the first static inverted circuit receives the reset signal and resets the potential of the internal terminal to the low level voltage and the internal inverted terminal to the high level voltage; the second static inverted circuit receives the set signal and sets the potential of the internal terminal to the first level voltage and the potential of the inverted signal to the low level voltage.

15. The touch display apparatus of claim 14, wherein each of the first static inverted circuit and the second static inverted circuit comprises a first transistor, a second transistor, and a third transistor; in the first static inverted circuit, the first transistor and the second transistor works as an inverter circuit, and the third transistor is served as a reset transistor; in the second static inverted circuit, the first transistor and the second transistor works as an inverter circuit, and the third transistor is served as a set transistor.

16. The touch display apparatus of claim 10, wherein the shift register circuit is a bidirectional shift register circuit, and is selectively operated in a forward direction and a reverse direction for sequentially applying the pulse signals to the gate lines; each shift register unit receives two clock signal, a first scan start signal, and a second scan start signal; one of the two clock signal is applied to the FF circuit as the reset signal, and the other of the two clock signal is applied to the output circuit.

17. The touch display apparatus of claim 10, wherein the control circuit further receives a second touch signal, the first touch signal is inverted with the second touch signal; the second touch signal clamps the potential of the internal inverted terminal.

* * * * *